(12) United States Patent
Hatakeyama et al.

(10) Patent No.: US 8,617,800 B2
(45) Date of Patent: Dec. 31, 2013

(54) PATTERNING PROCESS

(75) Inventors: Jun Hatakeyama, Jyoetsu (JP);
Kazuhiro Katayama, Jyoetsu (JP);
Yoshio Kawai, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 423 days.

(21) Appl. No.: 12/458,884

(22) Filed: Jul. 27, 2009

(65) Prior Publication Data

US 2010/0055621 A1 Mar. 4, 2010

(30) Foreign Application Priority Data

Sep. 3, 2008 (JP) ................................. 2008-226201

(51) Int. Cl.
*G03F 7/26* (2006.01)

(52) U.S. Cl.
USPC .......................................................... 430/322

(58) Field of Classification Search
USPC .................. 430/311, 313, 323, 325, 326, 322
See application file for complete search history.

(56) References Cited

U.S. PATENT DOCUMENTS

| | | | |
|---|---|---|---|
| 2002/0119612 A1 | 8/2002 | Ohuchi et al. | |
| 2006/0019195 A1 | 1/2006 | Hatakeyama et al. | |
| 2008/0020562 A1* | 1/2008 | Soda | 438/618 |
| 2008/0032492 A1* | 2/2008 | Baek | 438/595 |
| 2008/0090172 A1 | 4/2008 | Hatakeyama et al. | |
| 2008/0118860 A1 | 5/2008 | Harada et al. | |
| 2008/0166638 A1 | 7/2008 | Jung et al. | |
| 2008/0286683 A1* | 11/2008 | Brodsky et al. | 430/270.1 |
| 2009/0035584 A1* | 2/2009 | Tran et al. | 428/446 |
| 2009/0233226 A1* | 9/2009 | Allen et al. | 430/281.1 |

FOREIGN PATENT DOCUMENTS

| | | |
|---|---|---|
| JP | B2-3504247 | 12/2003 |
| JP | A-2005-128509 | 5/2005 |
| JP | A-2005-197561 | 7/2005 |
| JP | A-2006-293329 | 10/2006 |
| JP | B2-3981825 | 7/2007 |
| JP | A-2007-199653 | 8/2007 |
| JP | A-2007-218943 | 8/2007 |
| JP | A-2008-028037 | 2/2008 |
| JP | A-2008-111103 | 5/2008 |
| JP | A-2008-122932 | 5/2008 |
| JP | A-2008-170952 | 7/2008 |
| WO | WO 2008/067228 A1 | 6/2008 |

OTHER PUBLICATIONS

Dec. 18, 2012 Office Action issued in Japanese Patent Application No. 2009-166373 (with partial translation).

(Continued)

*Primary Examiner* — Brittany Raymond
(74) *Attorney, Agent, or Firm* — Oliff & Berridge, PLC

(57) ABSTRACT

There is disclosed a patterning process including steps of at least: forming a photoresist film on a substrate; exposing the photoresist film to a high energy beam; developing by using a developer; forming a photoresist pattern; and then forming a spacer on the photoresist pattern sidewall, thereby forming a pattern on the substrate, a patterning process, wherein at least the photoresist pattern having the hardness of 0.4 GPa or more or the Young's modulus of 9.2 GPa or more as a film strength is formed, and a pattern is formed on the substrate by forming a silicon oxide film as the spacer on the photoresist pattern sidewall. There can be provided a patterning process without causing a deformation of a resist pattern and an increase in LWR at the time of forming a silicon oxide film on a photoresist pattern.

12 Claims, 3 Drawing Sheets

(56) References Cited

OTHER PUBLICATIONS

Fedynyshyn, Theodore, "Advances in Resist Technology and Processing XIX," *Proceedings of SPIE—The International Society for Optical Engineering*, vol. 4690, Mar. 4-6, 2002, pp. xxix-xliii.

Owa et al., "Immersion lithography; its potential performance and issues," *Proceedings of SPIE—The International Society for Optical Engineering*, vol. 5040, 2003, pp. 724-733.

Shibuya et al., "Performance of Resolution Enhancement Technique Using Both Multiple Exposure and Nonlinear Resist,"*Japanese Journal of Applied Physics*, vol. 33, No. 12B, Part 1, Dec. 1994, pp. 6874-6877.

Fritze et al., "Nanofabrication with deep-ultraviolet lithography and resolution enhancements," *J. Vac. Sci. Technol. B*, vol. 17, No. 6, Nov./Dec. 1999, pp. 3310-3313.

Kono et al., "Implementation of immersion lithography to NAND/CMOS device manufacturing," *4th International Symposium on Liquid Immersion*, Presentation No. PR-01, 2007, pp. 1-24.

Kawasaki et al., "Fabrication of 32nm Contact/Via Hole by Photo-lithographic-friendly Method," *Proceedings of SPIE—The International Society for Optical Engineering*, vol. 6923, 2008, pp. 692333-1-692333-7.

Suda et al., "Vertical Batch Atomic Deposition Equipment ALDINNA for 45-nm Node Devices," *Hitachi Review*, vol. 89, No. 4, Apr. 2007, pp. 46-49.

Nakaue et al., "Evaluation of the Mechanical Properties of Thin Films using Nanoindentation," *Kobe Steel Engineering Reports*, vol. 52, No. 2, Sep. 2002, pp. 74-77.

George et al., "Atomic layer controlled deposition of $SiO_2$ and $Al_2O_3$ using ABAB . . . binary reaction sequence chemistry," *Applied Surface Science*, vol. 82/83, 1994, pp. 460-467.

Yamaguchi et al., "Atomic-layer chemical-vapor-deposition of silicon dioxide films with an extremely low hydrogen content," *Applied Surface Science*, vol. 130-132, 1998, pp. 202-207.

* cited by examiner

FIG. 2
PRIOR ART
2 — 1 DEVELOPMENT OF PHOTORESIST
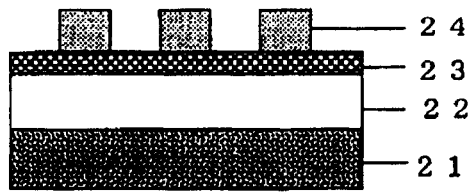
2 — 2 ETCHING OF HARD MASK
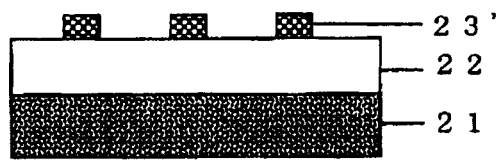
2 — 3 FORMATION OF SILICON OXIDE FILM
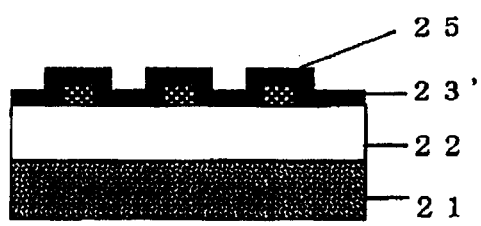
2 — 4 FORMATION OF SPACER
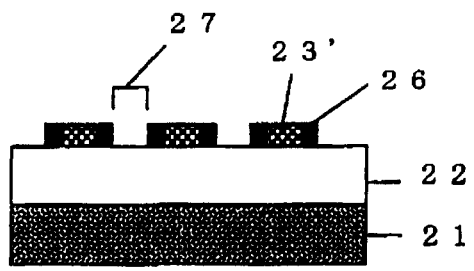
2 — 5 SPACER SPACE EMBEDDING
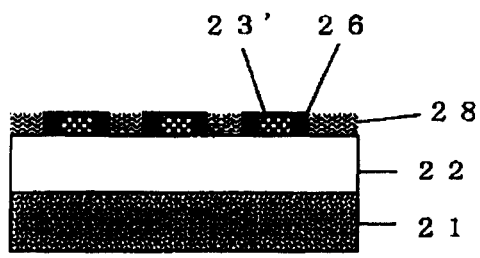
2 — 6 REMOVAL OF SPACER
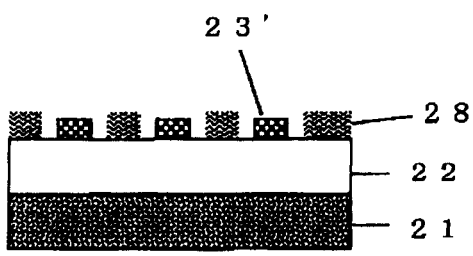
2 — 7 ETCHING OF PROCESSING SUBSTRATE
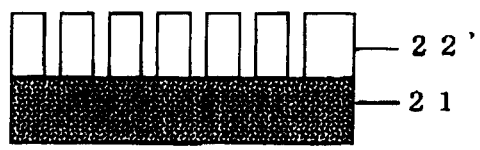

FIG. 3
PRIOR ART
3 − 1 DEVELOPMENT OF PHOTORESIST
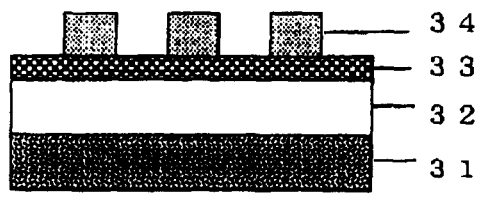
3 − 2 ETCHING OF HARD MASK
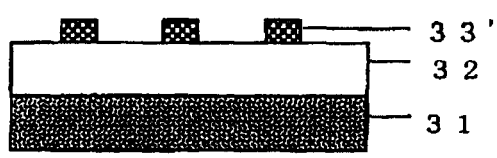
3 − 3 FORMATION OF SILICON OXIDE FILM
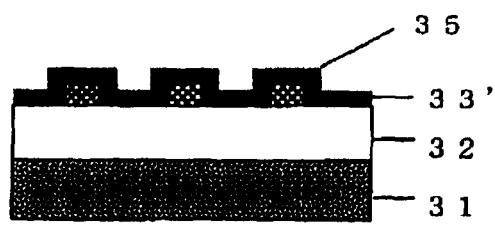
3 − 4 FORMATION OF SPACER
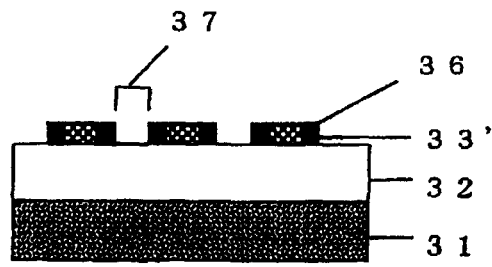
3 − 5 REMOVAL OF HARD MASK
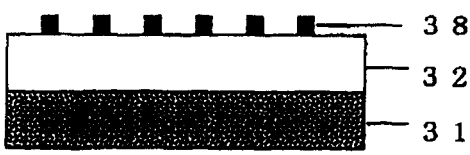
3 − 6 ETCHING OF PROCESSING SUBSTRATE
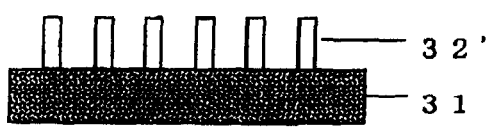

PATTERNING PROCESS

BACKGROUND OF THE INVENTION

Field of the Invention

The present invention relates to a patterning process using a sidewall spacer method.

In recent years, as LSI progresses toward higher integration and further acceleration in speed, miniaturization of a pattern rule is required. In the light-exposure used as a general technology nowadays, resolution inherent to wavelength of a light source is approaching to its limit. In 1980s, a g-line (436 nm) or an i-line (365 nm) of a mercury lamp was used as an exposure light. As a mean for further miniaturization, shifting to a shorter wavelength of an exposing light was assumed to be effective. As a result, in a mass production process after DRAM (Dynamic Random Access Memory) with 64-megabits (0.25 μm or less of a processing dimension) in 1990s, a KrF excimer laser (248 nm), a shorter wavelength than an i-beam (365 nm), was used in place of an i-line as an exposure light source.

However, in production of DRAM with an integration of 256 M, 1 G and higher which require further miniaturized process technologies (process dimension of 0.2 μm or less), a light source with a further short wavelength is required, and thus a photo lithography using an ArF excimer laser (193 nm) has been investigated seriously since about a decade ago. At first, an ArF lithography was planned to be applied to a device starting from a 180-nm node device, but a KrF excimer laser lithography lived long to a mass production of a 130-nm node device, and thus a full-fledged application of an ArF lithography will start from a 90-nm node. Further, a study of a 65-nm node device by combining with a lens having an increased NA till 0.9 is now underway. Further shortening of wavelength of an exposure light is progressing towards the next 45-nm node device, and for that an $F_2$ lithography with a 157-nm wavelength became a candidate. However, there are many problems in an $F_2$ lithography; an increase in cost of a scanner due to the use of a large quantity of expensive $CaF_2$ single crystals for a projector lens, extremely poor sustainability of a soft pellicle, which leads to a change of an optical system due to introduction of a hard pellicle, a decrease in an etching resistance of a resist film, and the like. Because of these problems, it was proposed to postpone an $F_2$ lithography and to introduce an ArF immersion lithography earlier (Proc. SPIE Vol. 4690, xxix).

In an ArF immersion lithography, a proposal is made to impregnate water between a projector lens and a wafer. A refractive index of water at 193 nm is 1.44, and therefore a pattern formation is possible even if a lens with a numerical aperture (NA) of 1.0 or more is used, and moreover, theoretically NA may be increased to near 1.44. In the beginning, deterioration of a resolution and a shift of a focus due to a change of refractive index associated with a change of water temperature were pointed out. However, the problems associated with the change in the refractive index have been solved by controlling the water temperature within $1/100°$ C. In addition, it was also confirmed that the effect of heat generation from a resist film by light exposure was almost insignificant. As to the concern of a pattern transcription of microbubbles in water, it was also confirmed that formation of bubbles from a resist film by exposure was insignificant if water is fully degassed.

In the early period of an immersion lithography in 1980s, a proposal was made to immerse an entire stage into water. However, a partial fill method having a nozzle of water supply and of drainage in which water is introduced only between a projector lens and a wafer in order to meet the movement of a high-speed scanner was adopted. By an immersion using water, designing of a lens with NA of 1 or higher became theoretically possible. However, there appeared a problem in it that a lens dimension in an optical system based on a conventional refractive index system becomes extraordinary large thereby leading to distortion of a lens due to its own weight. A proposal was made to design a catadioptric optical system for a more compact lens, which accelerated a speed in designing a lens having NA of 1.0 or more. Now a possibility of a 45-nm node is shown by combining a lens having NA of 1.2 or more with a super resolution technology (Proc. SPIE Vol. 5040, p. 724), and in addition, a development of a lens with NA 1.35 is underway.

As a 32-nm node lithography technique, a lithography of a vacuum ultraviolet beam (EUV) with a wavelength of 13.5 nm is known. Problems of an EUV lithography are requirements for a higher laser output power, a higher sensitivity of a resist film, a higher resolution, a lower line edge roughness (LWR), a non-defective MoSi laminate mask, a lower aberration of a reflective mirror, and the like, and thus there are mounting problems to be solved.

A maximum resolution in a water immersion lithography using a lens with NA of 1.35 is 40 to 38 nm, and there is no possibility to reach 32 nm. Accordingly, development of a material having a higher refractive index is underway to increase NA further. A limiting factor of NA in a lens is determined by a minimum refractive index among a projector lens, a liquid, and a resist film. In the case of a water immersion, a refractive index of water is the lowest as compared with a projector lens (refractive index of a synthetic quartz is 1.5) and a resist film (refractive index of a conventional methacrylate type is 1.7), and thus NA of the projector lens has been determined by a refractive index of water. Recently, a highly transparent liquid having a refractive index of 1.65 is under development. In this case, a refractive index of a projector lens made of a synthetic quartz is the lowest, and thus a material for a projector lens with a high refractive index needs to be developed. A refractive index of LUAG ($Lu_3Al_5O_{12}$) is 2 or more, and thus it is expected as the most promising material, but has problems of a large double refraction and absorption. In addition, even though a projector lens material with a refractive index of 1.8 or more is developed, the highest NA reachable is 1.55 for a liquid with a refractive index of 1.65, and thus 32 nm may not be resolved.

To resolve 32 nm, a liquid with a refractive index of 1.8 or more is necessary. However, a material for it has not been found yet, because an absorption and a refractive index are in a trade-off relationship at the moment. In case of an alkane compound, a bridged cyclic compound is more preferable than a linear compound in order to increase a refractive index, but a cyclic compound has a problem in that it cannot follow a high-speed scanning of a stage of an exposure instrument because of its high viscosity. In addition, if a liquid having a refractive index of 1.8 is developed, a minimum refractive index lies in a photoresist film, and therefore, a photoresist film with a refractive index of 1.8 or more is also needed.

Recently, a double patterning process, in which a pattern is formed by a first exposure and development, and a pattern is formed by a second exposure exactly in a space of the first pattern, is drawing an attention (Jpn. J. Appl. Phys., Vol. 33 (1994), p. 6874-6877, Part 1, No. 12B, December 1994). Many processes are proposed as the double patterning method. For example, there is a method in which a photoresist pattern with a line and space interval of 1:3 is formed by a first exposure and development, an underlying hard mask is processed by dry etching, an another hard mask is formed on it, then, by exposure and development of a photoresist film to form a line pattern in a space formed by the first exposure, and then the hard mask is dry etched to form a line-and-space pattern with a half width of the first pattern pitch. There is also another method in which a photoresist pattern with a space and line interval of 1:3 is formed by a first exposure and development, an underlying hard mask is processed by dry etching, a photoresist film is applied on it, the second space-pattern is exposed on a remaining part of the hard mask, and then the hard mask is dry etched. In both methods, hard masks are processed by two dry etching steps.

In the former methods as mentioned above, a hard mask needs to be made twice. In the latter method, only one layer of a hard mask is needed, but a trench pattern, in which a resolution is more difficult as compared with a line pattern, needs to be formed. In the latter method, a negative resist composition may be used for formation of a trench pattern. With this method, a high contrast light similar to that used to form a line by a positive pattern may be used. However, a negative resist composition has a lower dissolution contrast as compared with a positive resist composition, and thus, a negative resist composition gives a lower resolution power as compared with the case in which lines are formed by a positive resist composition when a negative resist composition is used to form the same dimension of a trench pattern. In the latter method, it may be possible to apply a thermal flow method, in which a wide trench pattern is formed by using a positive resist composition and then the trench pattern is shrunk by heating a substrate, and a RELACS (resistered trade mark) method in which a water-soluble layer is coated on a trench pattern after development and then the trench is shrunk by a thermal crosslink of a resist film surface. In these methods, however, there are problems of deterioration of a proximity bias and a low throughput due to further complicated processes.

In the both former and the latter methods, two etchings are necessary in substrate processing, thereby causing problems of a lower throughput as well as a deformation and a misalignment of the pattern due to these two etchings.

To perform the etching only once, there is a method in which a negative resist composition is used in the first exposure and a positive resist composition is used in the second exposure. There is another method in which a positive resist composition is used in the first exposure and a negative resist composition dissolved in a higher alcohol having 4 or more carbon atoms and not dissolving the positive resist composition is used in the second exposure. In these methods, a resolution is deteriorated due to the use of a negative resist composition having a low resolution.

The most critical problem in the double patterning is an overlay accuracy of the first and the second patterns. A magnitude of the position displacement corresponds to variation of the line dimension. Thus, for example, to form a 32-nm line with 10% accuracy, an overlay accuracy within 3.2 nanometers is necessary. Because an overlay accuracy of a currently used scanner is about 8 nm, a substantial improvement in the accuracy is necessary.

Because of problem of the overlay accuracy of a scanner and the difficulty to divide one pattern into two, a method in which a pitch is divided into halves in a single exposure is investigated.

A method in which a pitch is divided into halves by forming films on both sides of a line pattern sidewall is proposed (J. Vac. Sci. Technol. B17(6), November/December 1999). For this sidewall spacer method, a spacer space method, in which a hard mask in the resist underlayer and a film embedded into a space between films attached on its sidewall are used as an etching pattern, and a spacer line method, in which a film attached on a hard mask sidewall in the resist underlayer is used as an etching pattern, are proposed (4th International Symposium on Liquid Immersion (2007), Presentation No.: PR-01, Title: Implementation of immersion lithography to NAND/CMOS device manufacturing). In any of these methods, a film attached on a hard mask sidewall in the resist underlayer is used as an etching mask. Deviation of a resist line from a target dimension results in lines with different CDs used as an etching mask in a spacer space method and leads to variation in line positions in a spacer line method. In any of the methods, both a film thickness of the sidewall spacer and a dimension of resist pattern after development need to be controlled with a further high precision. In any of the sidewall spacer methods, a pitch can be made half by a single exposure. However, a line terminal point is formed in a shape like a donut, and thus outermost terminal lines are unnecessary in a certain case, thereby requiring exposures at least twice in order to erase them. In this case, however, a highly accurate alignment is not necessary in order to halve a pitch in the second exposure.

The spacer space method in a sidewall spacer method disclosed in 4th International Symposium on Liquid Immersion (2007), Presentation No.: PR-01, Title: Implementation of immersion lithography to NAND/CMOS device manufacturing is shown in FIG. 2, and the process steps will be described hereinafter.

On a substrate 21, a processing layer 22 and a hard mask 23 are formed. On the hard mask 23, a resist film is formed and then a photoresist pattern 24 is obtained (FIG. 2-1). A photoresist pattern 24 is transferred to the hard mask 23 by dry etching (FIG. 2-2), and then a silicon oxide film 25 is formed on the obtained hard mask pattern 23' by a CVD method (FIG. 2-3). The silicon oxide film on an upper part of the hard mask pattern 23' and in a space part 27 is removed by dry etching to form a spacer 26 (FIG. 2-4), and then a spacer space 28 is embedded into the space part 27. Spacer spaces on the upper part of the hard mask pattern 23' and the upper part of the spacer 26 are removed (FIG. 2-5), and then the spacer 26 is removed (FIG. 2-6) to obtain a processing layer 22' (FIG. 2-7). Accordingly, the spacer 26 attached to the sidewall of the hard mask pattern 23' is transferred to the processing layer 22 by a pattern reversal to obtain the processing layer 22'. The spacer line process in the sidewall spacer method is shown in FIG. 3, and the process steps will be described below.

On a substrate 31, a processing layer 32 and a hard mask 33 are formed. On the hard mask 33, a photoresist film is formed and then a photoresist pattern 34 is obtained (FIG. 3-1). A resist pattern 34 is transferred to the hard mask 33 by dry etching to obtain a hard mask pattern 33' (FIG. 3-2). A silicon oxide film 35 is formed on the hard mask pattern 33' by a CVD method (FIG. 3-3). The silicon oxide film on an upper part of the hard mask pattern 33' and in a space part 37 is removed by dry etching to form a spacer 36 (FIG. 3-4). The hard mask pattern 331 is removed while spacer lines 38 are left (FIG. 3-5), and by using them as a mask a processing layer 32 is processed to obtain a processing layer 32' (FIG. 3-6).

As a hard mask, $SiO_2$, SiN, SiON, p-Si, TiN, a carbon film, and the like are used, and a hard mask is formed by a CVD method or a spin coat method. Between a hard mask and a photoresist film, an organic anti-reflection film or a trilayer formed of a SOG film having an anti-reflection function and a carbon film may be formed. In the sidewall spacer method, a material other than a hard mask is used as the spacer in order to process a hard mask and a substrate thereunder.

In the sidewall spacer methods as mentioned above, because an etching pattern is made based on a film attached only on a hard mask sidewall, a film attached on a hard mask and to a spacer must be removed. In the spacer space method, a sidewall pattern must be removed after a space is embedded, and in the spacer line method, only a hard mask must be removed after formation of a space pattern on a hard mask sidewall. There are many steps for etching and film removal, and thus a throughput is low and the process is costly.

A method in which a hole pattern diameter is contracted by forming a silicon oxide film directly on a resist pattern with a chemical vapor deposition (CVD) method is proposed (Proc. SPIE Vol. 6923, p. 692333-1 (2008)), and a study to attach a silicon oxide film directly on a resist pattern is progressing. An atomic layer deposition (ALD) method, in which a silicon oxide is laminated in an atomic level, is one of the CVD methods (Hitachi Review, April 2007, Vertical Batch Atomic Layer Deposition Equipment ALDINNA for 45-nm Node Device). This method is excellent in conformal properties of a film and homogeneity of film thickness, and thus it is assumed to be suitable for formation of a silicon oxide film for a sidewall spacer. A drawback of an ALD method has been a low throughput, but a treatment capacity in terms of unit time per one wafer is increasing by a batchwise treatment of a large number of wafers.

When a silicon oxide film is formed by using a CVD method or an ALD method at the temperature of equal to or lower than a glass transition temperature (Tg) of a base polymer, the silicon oxide film may be attached directly to a resist pattern without a significant deformation of a resist pattern. However, observation of the resist pattern after attachment of the silicon oxide film reveals a problem of increase in a line width roughness (LWR).

Mechanical properties of a thin film may be measured by a tensile test instrument, an ultrasonic wave velocity measurement method, a vibration reed method, and the like, but formation of a very thin film is difficult. A film stress of a very thin film, in particular with a thickness of several ten nanometers, is measured by a deformation amount of a substrate by a Newton ring method or a contact probe method, or from a Raman scattering, and so on. However, in recent years, a validity of a mechanical strength of a local fine pattern measured by a nanoindentation method has been shown, and a measurement result of a mechanical strength of a Low-k film is reported (Kobe Steel Engineering Reports, Vol. 52, No. 2, p. 74, September (2002)). A resist underlayer having a mechanical strength defined by a nanoindenter is also proposed (Japanese Patent Laid-Open (kokai) No. 2007-218943).

Accordingly, a method for photoresist pattern formation without causing a deformation of a photoresist pattern and an increase in LWR even by attachment of a silicon oxide film is sought.

SUMMARY OF THE INVENTION

As mentioned above, in a sidewall spacer method in which a silicon oxide film is formed as a spacer on a photoresist pattern sidewall and an underlayer is processed based on this spacer, when the oxide film is formed directly on the photoresist pattern, there occurred problems such as a deformation of the photoresist pattern thereby causing problems such as contraction of a dimension of the photoresist pattern and an increase in LWR.

The present invention was made in view of the problems as mentioned above, and has an object to provide, in a sidewall spacer method in which a silicon oxide film is formed as a spacer on the photoresist pattern sidewall and an underlayer is processed based on this spacer, a patterning process without causing a deformation of the photoresist pattern and an increase in LWR at the time of formation of the silicon oxide film on the photoresist pattern.

In order to solve the problems as mentioned above, in a patterning process including steps of at least: forming a photoresist film on a substrate; exposing the photoresist film to a high energy beam; developing by using a developer; forming a photoresist pattern; and then forming a spacer on the photoresist pattern sidewall, thereby forming a pattern on the substrate, the present invention provides a patterning process, wherein at least the photoresist pattern having the hardness of 0.4 GPa or more or the Young's modulus of 9.2 GPa or more as a film strength is formed and a pattern is formed on the substrate by forming a silicon oxide film as the spacer on the photoresist pattern sidewall.

By using a photoresist pattern having mechanical strength with the harness of 0.4 GPa or more or the Young's modulus of 9.2 GPa or more as a film strength, a deformation of the photoresist pattern and an increase in LWR at the time of formation of the silicon oxide film for formation of a spacer may be avoided.

Further, the silicon oxide film is preferably formed by a CVD method or an ALD method.

By using a CVD method or an ALD method in the step of forming the silicon oxide film as mentioned above, the silicon oxide film can be formed at a temperature equal to or lower than a glass transition temperature (Tg) of a base polymer contained in a photoresist film composition, and thus the silicon oxide film may be directly attached without overly deforming a photoresist pattern.

Further, the hardness is preferably the one measured by a nanoindenter method.

As mentioned above, a nanoindenter method is preferably used as a method for measuring the mechanical strength of the photoresist film.

In addition, a photoresist film composition to form the photoresist film is preferably a chemically amplified positive resist composition.

As mentioned above, when a chemically amplified positive resist composition is used as the photoresist film composition for forming the photoresist film, a pattern with an extremely high precision may be obtained.

In addition, a base polymer contained in the photoresist film composition is preferably the one containing one or more adhesion groups selected from a hydroxyl group, a hydroxynaphthyl group, a hydroxyacenaphthyl group, a carboxy group, and a 2,2,2-trifluoro-1-hydroxyethyl group.

Accordingly, when a polymer containing a hydroxyl group having a hydrogen bonding property such as a hydroxyl group, a hydroxynaphthyl group, a hydroxyacenaphthyl group, a carboxy group, and a 2,2,2-trifluoro-1-hydroxyethyl group is used as the base polymer contained in the photoresist film composition, a glass transition temperature (Tg) of the polymer can be raised and its mechanical strength can be increased because of a hydrogen bond of these functional groups.

Further, the photoresist pattern is the one cured by a light irradiation or a heat treatment after development, and the spacer is formed on the photoresist pattern sidewall.

By a light irradiation or a heat treatment after development as mentioned above, a film strength of the photoresist pattern may be further increased.

Further, it is preferable that the method be carried out in such a way as the spacer formed on the photoresist pattern sidewall is formed by removing the silicon oxide film in a space part of the photoresist pattern and the silicon oxide film on an upper part of the photoresist pattern in the silicon oxide film formed on the photoresist pattern, and a processing substrate in the underlayer is processed by using the spacer on the photoresist pattern sidewall as a mask.

A sidewall spacer method like this in which a silicon oxide film is directly attached to a photoresist pattern has a substantial cost merit because the etching process is less as compared with a conventional sidewall spacer method in which a silicon oxide film is attached to an underlayer hard mask of a photoresist film.

Further, the processing substrate may be processed by using a processed carbon film as a mask, wherein the processed carbon film is obtained as following: before forming the photoresist film on the processing substrate, a carbon film with a carbon content of 75% or more by weight is formed by a CVD method or a spin coat method, and the carbon film is processed by dry etching by using the spacer on the photoresist pattern sidewall as a mask.

By using an underlayer film having a high carbon density as mentioned above, a dimensional controllability in etching of the processing substrate may be improved.

In addition, an anti-reflection film formed of a hydrocarbon material may be formed between the carbon film and the photoresist film.

By forming an anti-reflection film between the carbon film and the photoresist film, deterioration of the photoresist profile may be avoided.

As mentioned above, according to the present invention, in a patterning process including steps of at least: forming a photoresist film on a substrate; exposing the photoresist film to a high energy beam; developing by using a developer; forming a photoresist pattern; and then forming a spacer on the photoresist pattern sidewall, thereby forming a pattern on the substrate, a pattern may be formed in high accuracy without a pattern deformation and an increase in LWR at the time of formation of the silicon oxide film by using a material having a high mechanical strength with the hardness of 0.4 GPa or more or the Young's modulus of GPa or more as a film strength in the photoresist pattern.

BRIEF DESCRIPTION OF THE DRAWINGS

FIG. 2 is a schematic drawing illustrating an embodiment of a spacer space process in a conventional sidewall spacer method; and FIG. 3 is a schematic drawing illustrating an embodiment of a spacer line process in a conventional sidewall spacer method.

DETAILED DESCRIPTION OF THE PREFERRED EMBODIMENTS

Figure 1:
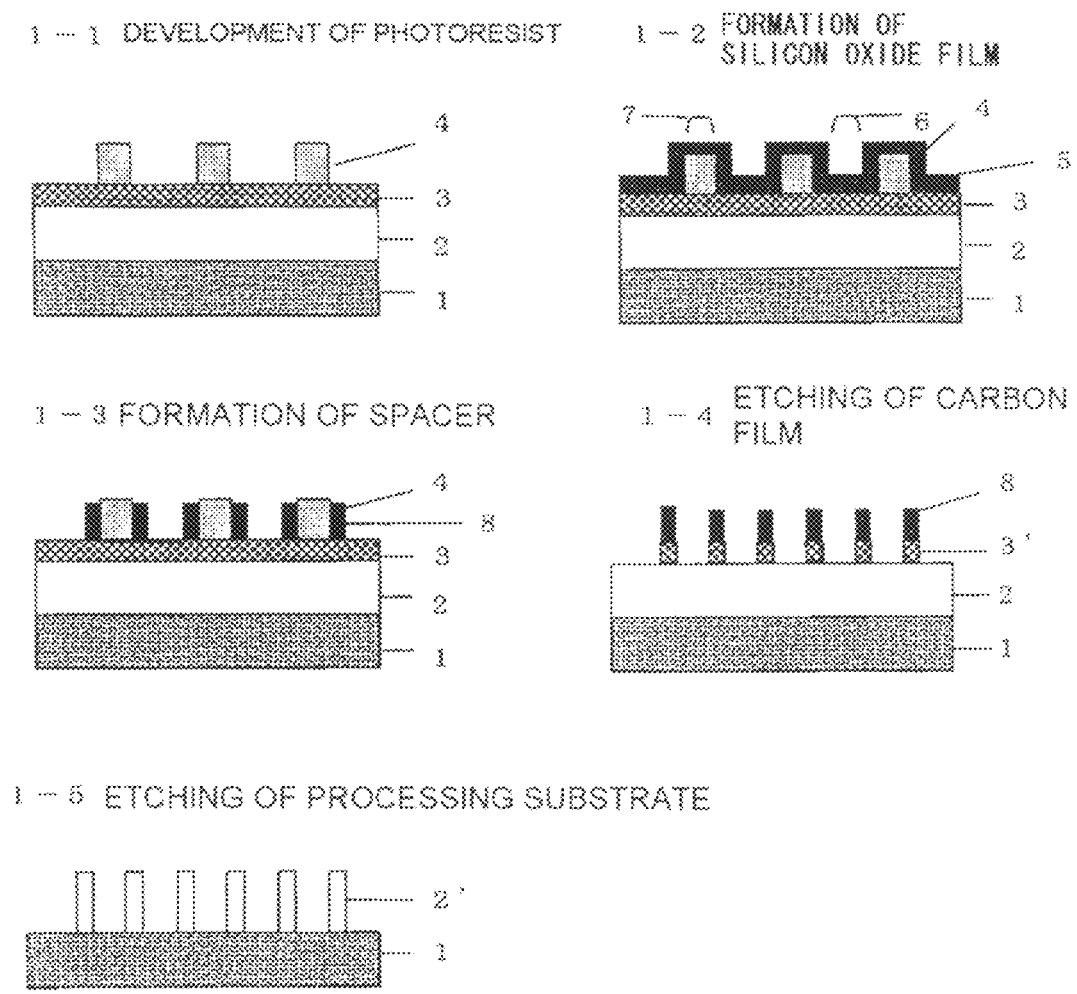
FIG. 1 is a schematic drawing illustrating an embodiment of a sidewall spacer method of the present invention.

Hereinafter, the present invention will be described more specifically.

As mentioned above, in a sidewall spacer method in which a silicon oxide film is formed on a photoresist pattern sidewall as a spacer and then an underlying layer is processed based on this spacer, a resist pattern is deformed when the oxide film is directly formed on the resist pattern, thereby causing problems of a dimensional shrinkage of the resist pattern and an increase in LWR. The inventors of the present invention assumed this is because the silicon oxide film is considerably hard with a stress being 20 GPa or more as the Young's modulus and this hard silicon oxide film is attached to a soft photoresist pattern thereby causing a deformation of the photoresist pattern, and then found that this line deformation did not occur evenly but occurred locally thereby leading to an increase in LWR.

Accordingly, in a patterning process including steps of: forming a photoresist film on a substrate; exposing the photoresist film to a high energy beam; developing by using a developer; forming a photoresist pattern; and then forming a spacer on the photoresist pattern sidewall, thereby forming a pattern on the substrate, the inventors of the present invention started to develop a photoresist film composition so that a deformation of a photoresist pattern and an increase in LWR may be avoided.

The inventors of the present invention found that, when a silicon oxide film was formed on a photoresist film sidewall having the hardness of less than 0.4 GPa or the Young's modulus of less than 9.2 GPa, a deformation of a pattern such as shrinkage of a resist top and an increase of a line width roughness (LWR) occurred. The inventors further found that, to solve this problem, the strength of the photoresist pattern on which a silicon oxide film is directly formed needs to have 0.4 GPa or more of the hardness or 9.2 GPa or more of the Young's modulus, preferably 0.42 GPa or more of the hardness or 9.5 GPa or more of the Young's modulus, more preferably 0.45 GPa or more of the hardness or 10.0 GPa or more of the Young's modulus, and further more preferably 0.5 GPa or more of the hardness or 10.5 GPa or more of the Young's modulus.

As a result, in a patterning process including steps of at least: forming a photoresist film on a substrate; exposing the photoresist film to a high energy beam; developing by using a developer; forming a photoresist pattern; and then forming a spacer on the photoresist pattern sidewall, thereby forming the pattern on the substrate, the inventors of the present invention found that a deformation of the photoresist pattern and an increase in LWR at the time of formation of a silicon oxide film may be avoided if at least the photoresist pattern has mechanical strength with the hardness of 0.4 GPa or more or the Young's modulus of 9.2 GPa or more as a film strength, and thus completed the present invention.

In the past, a base polymer containing a lactone group has been known as the base polymer having an adhesive property. However, a photoresist film composition having a mechanical strength of 0.4 GPa or more of the hardness or 9.3 GPa or more of the Young's modulus as a film strength cannot be obtained by a base polymer having only a lactone group as an adhesion group.

In addition to a lactone ring, an adhesion group including a hydroxyl group having a hydrogen bonding property is necessary. This is because a glass transition temperature (Tg) of a polymer is raised and its mechanical strength is increased owing to a hydrogen bond.

The adhesion groups having a hydrogen bonding property may be exemplified by a hydroxyl group, a hydroxynaphthyl group, a hydroxyacenaphthyl group, a carboxy group, and a 2,2,2-trifluoro-1-hydroxyethyl group. Among these repeating units "a", a hydroxynaphthyl group and a hydroxyacenaphthyl group are most preferable.

Repeating units containing a hydroxynaphthyl group and a hydroxyacenaphthyl group are exemplified by the following general formulae (a1) and (a2), respectively:

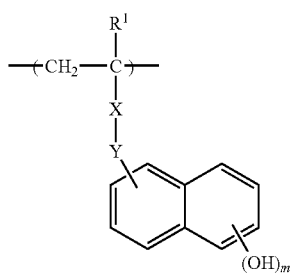

(a1)

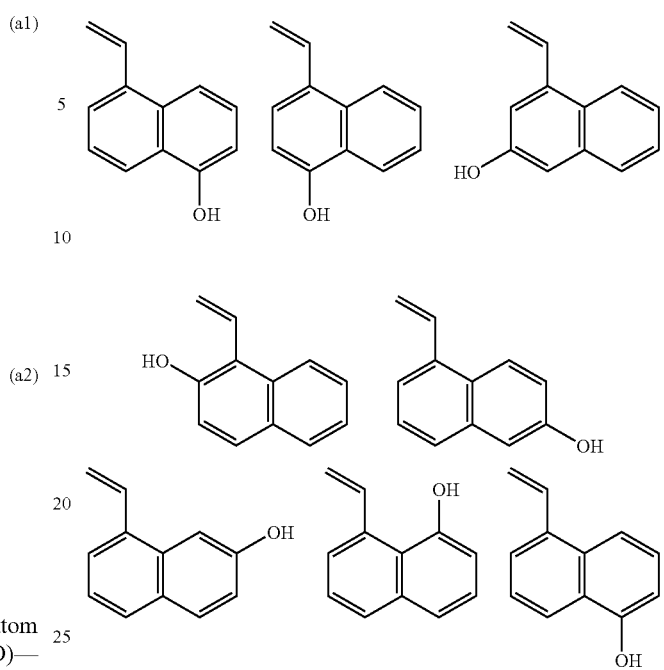

(a2)

wherein, $R^1$ represents the same or a different hydrogen atom or methyl group; X represents a single bond or a —C(=O)—O— group; Y represents a single bond, or a linear or a branched alkylene group having 1 to 6 carbon atoms and optionally containing an ester group or an ether group; reference characters "m" and "n" represent 1 or 2.

Here, the alkylene group having 1 to 6 carbon atoms may be exemplified by a methylene group, an ethylene group, a n-propylene group, an isopropylene group, a n-butylene group, an isobutylene group, a sec-butylene group, a n-pentylene group, an isopentylene group, a cyclopentylene group, a n-hexylene group, a cyclohexylene group, and the like.

Monomers to obtain repeating units represented by the general formulae (a1) and (a2) may be represented by the following general formulae (Ma1) and (Ma2), respectively. Here, $R^1$, X, Y, and reference characters "m" and "n" represent the same as before.

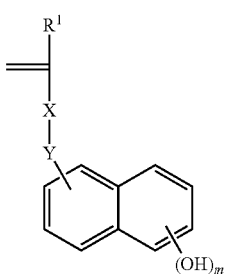

(Ma1)

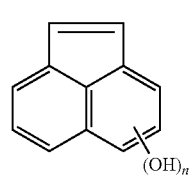

(Ma2)

Specific examples of the monomers represented by the general formula (Ma1) include following compounds.

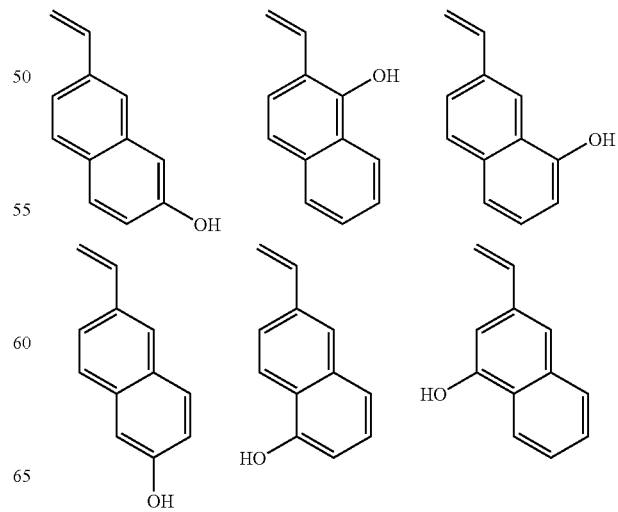

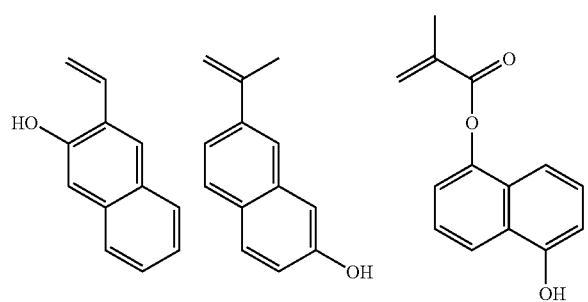
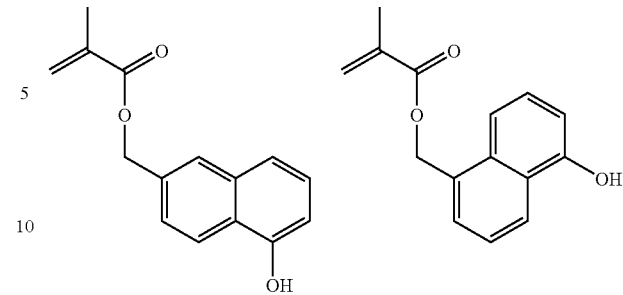
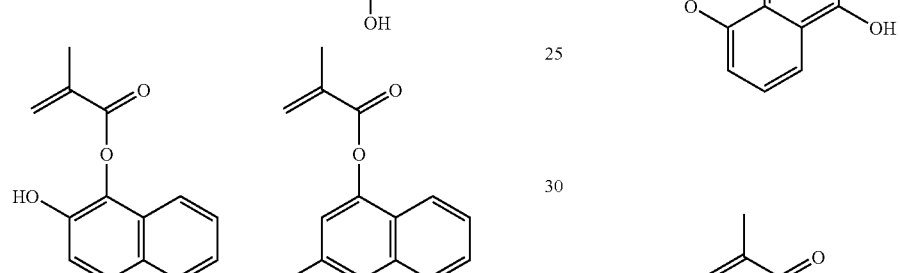
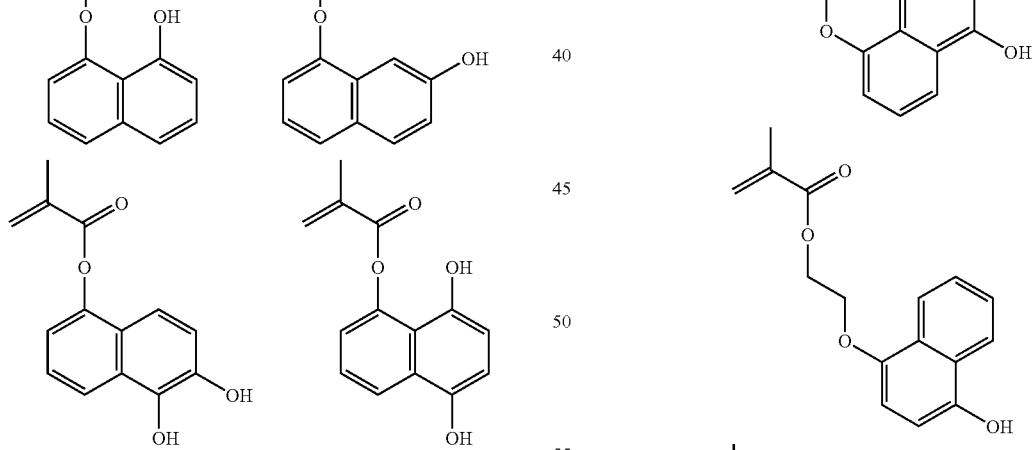
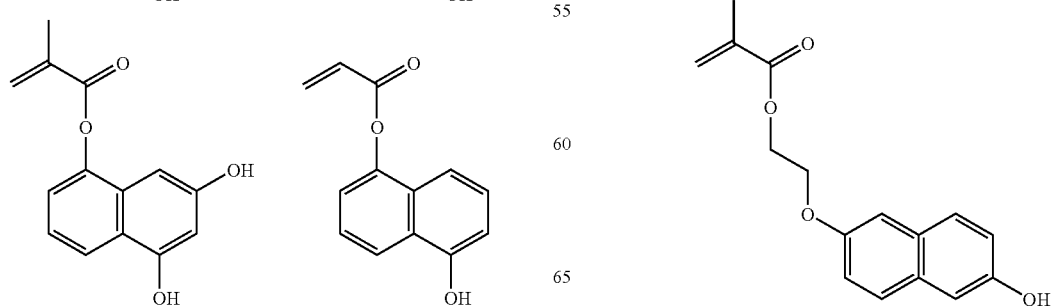

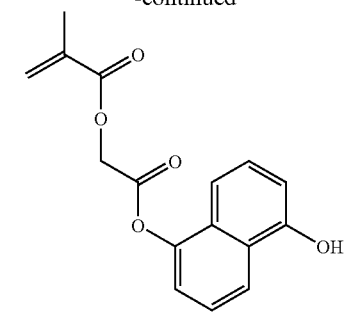
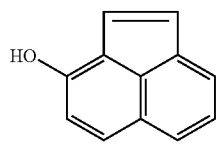 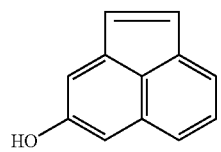
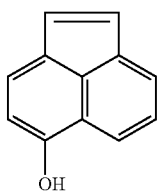 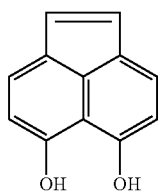
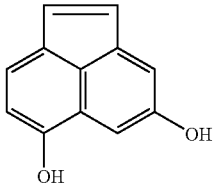
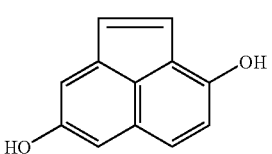
Examples of the monomers to obtain a repeating unit containing a hydroxyl group or a carboxy group include following compounds.
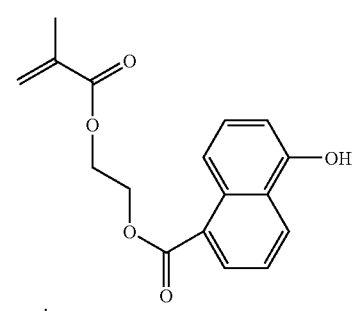
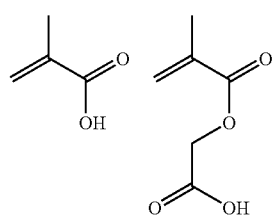
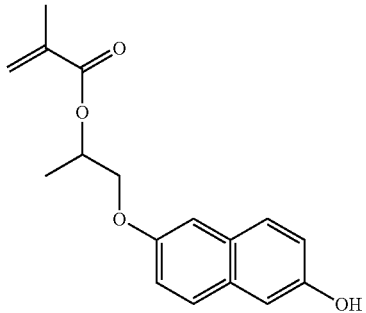
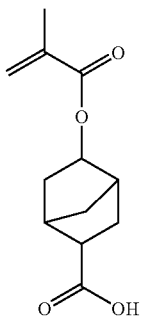
Specific examples of the monomers represented by the general formula (Ma2) include following compounds.

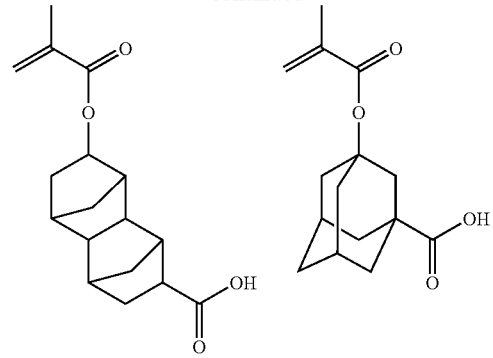
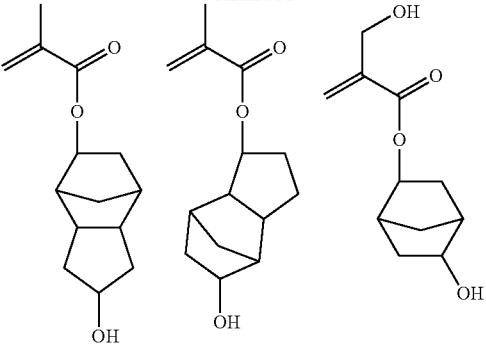
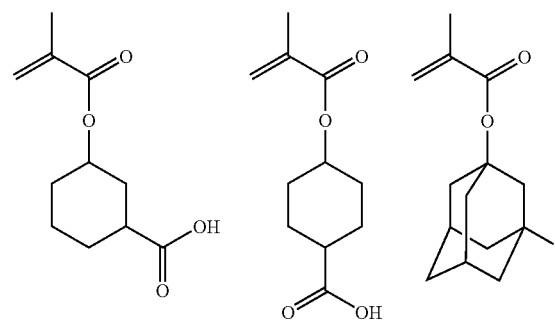
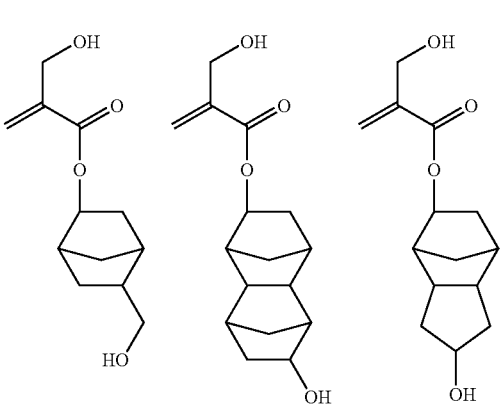
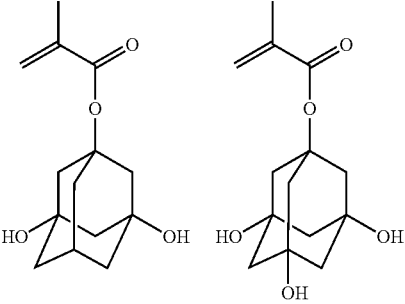
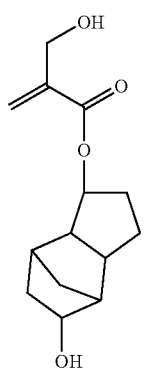
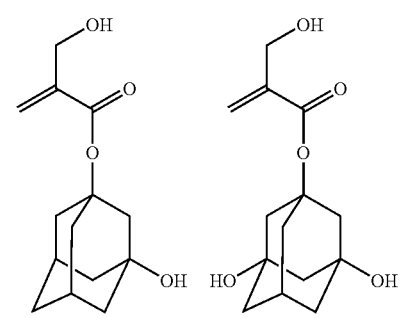
Examples of the repeating unit containing a 2,2,2-trifluoro-1-hydroxyethyl group include following compounds.
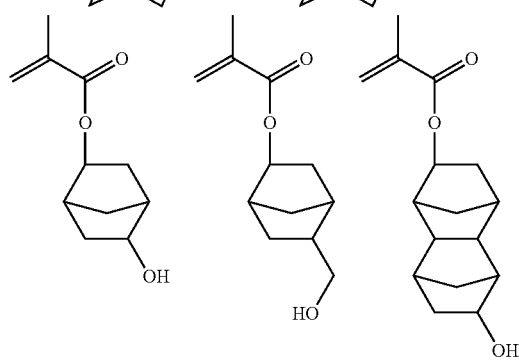
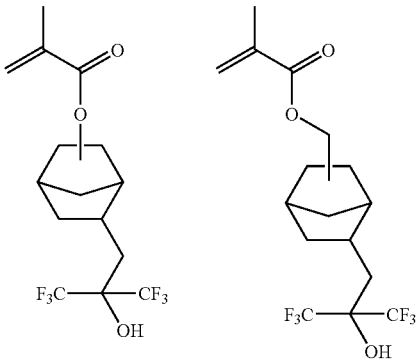

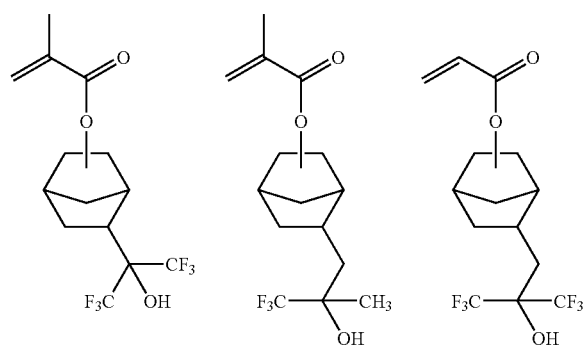
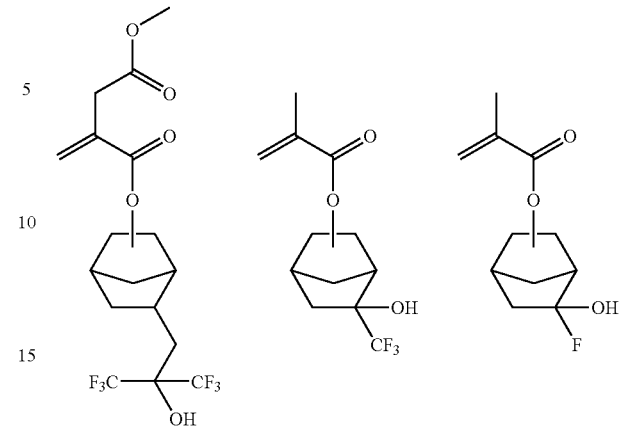
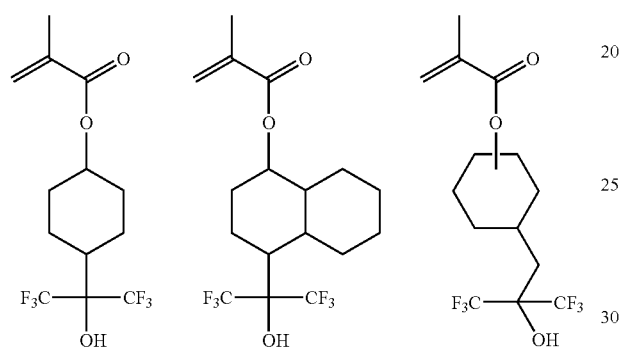
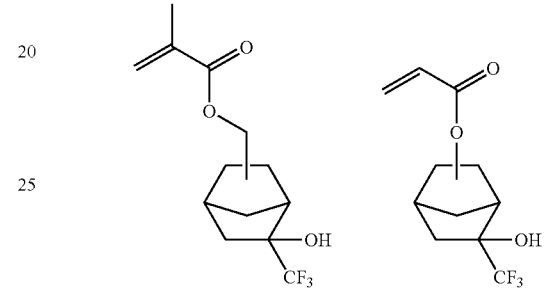
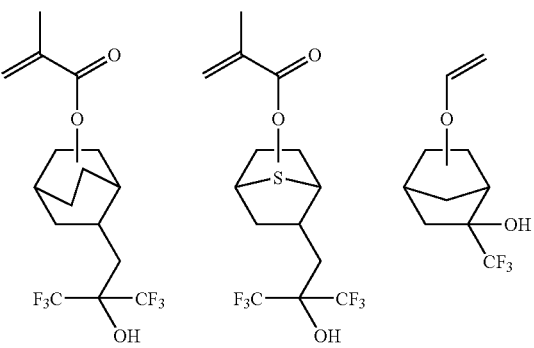
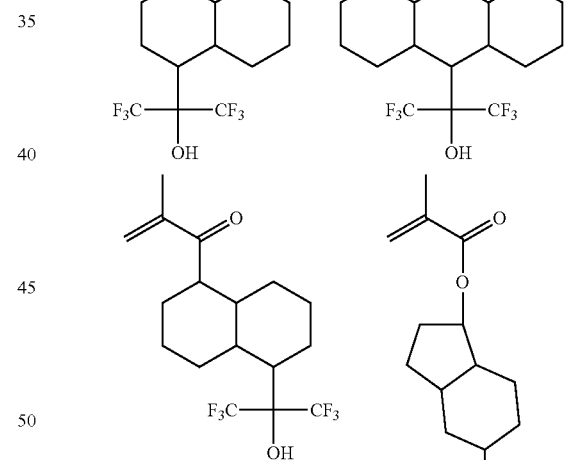
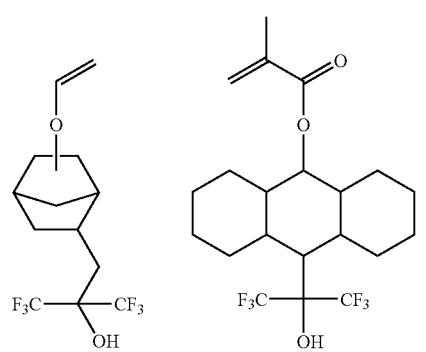
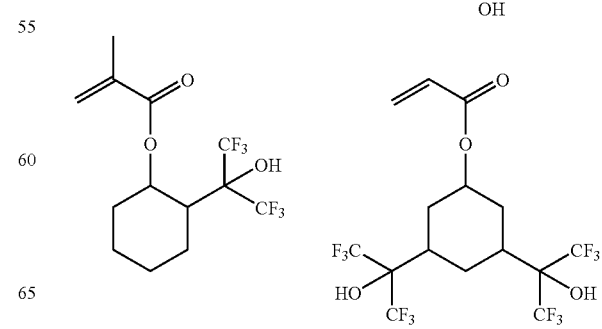

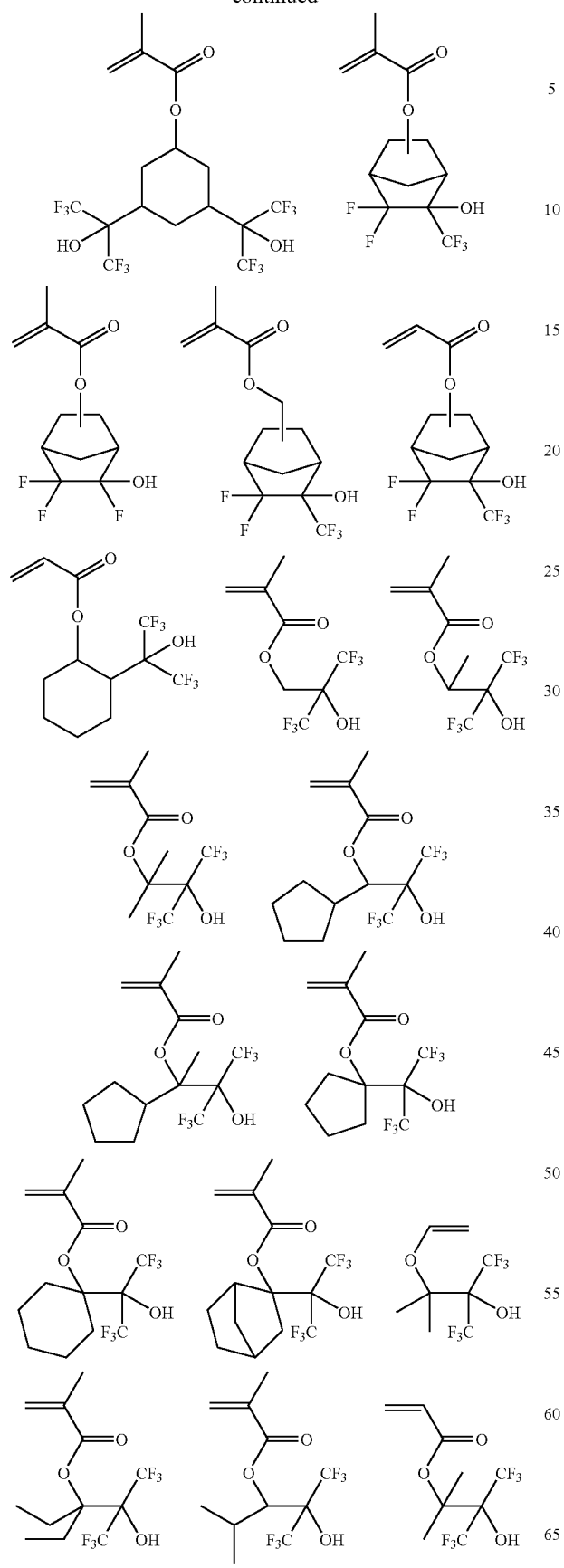
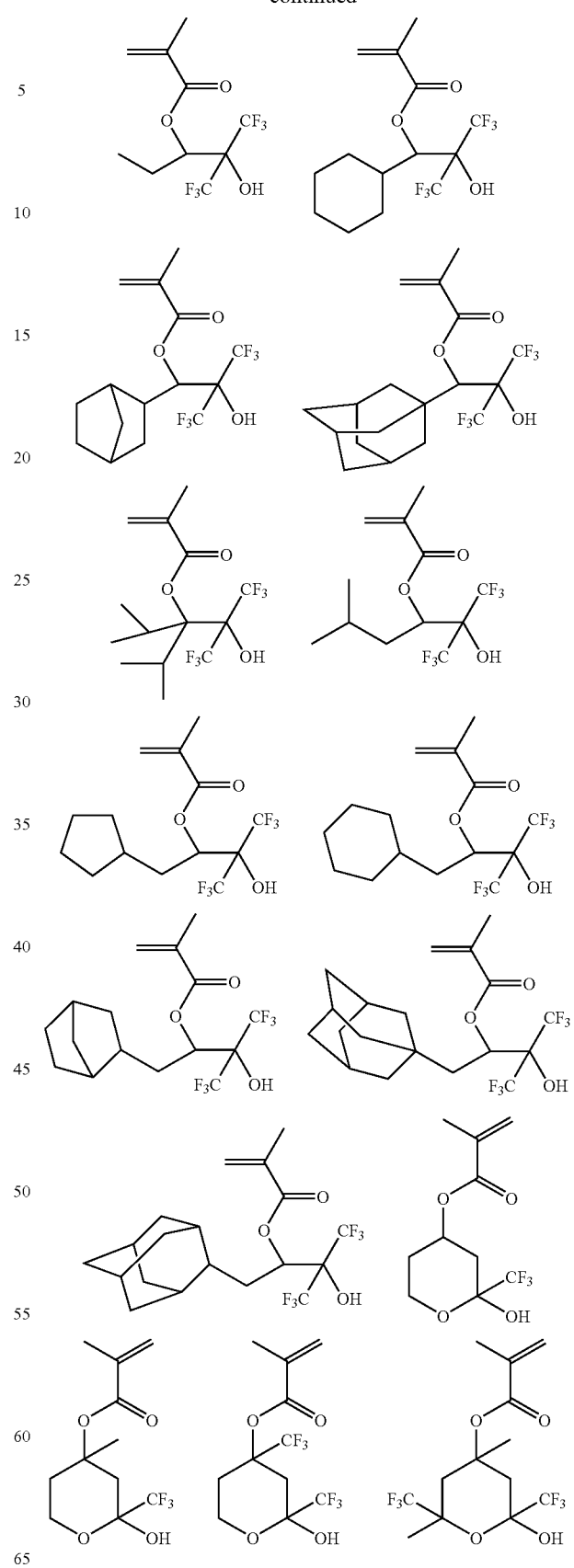

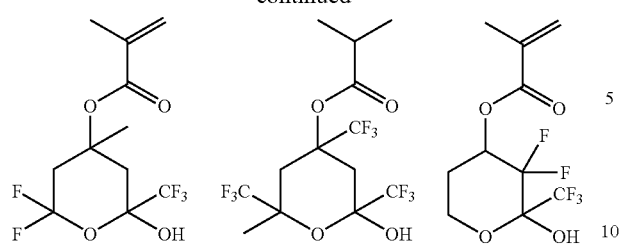
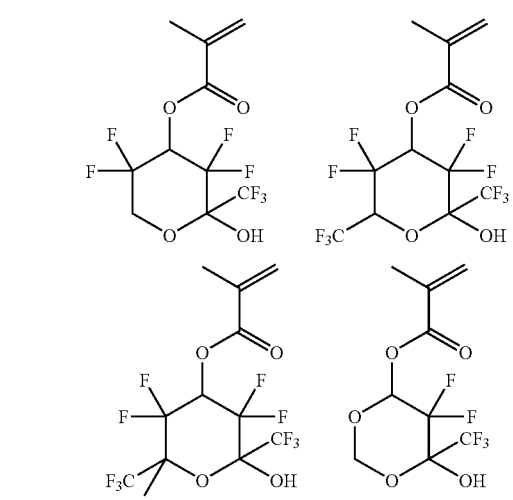
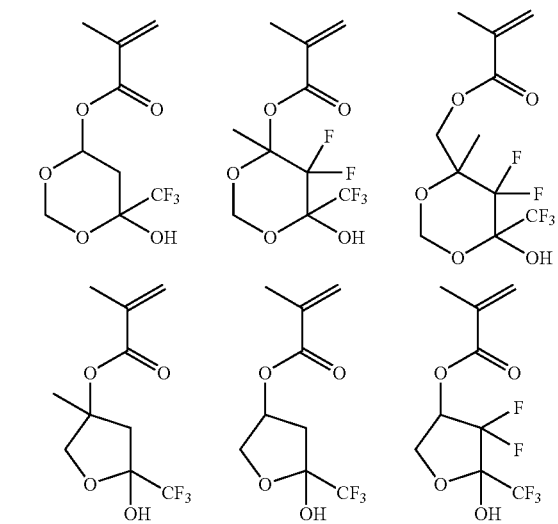

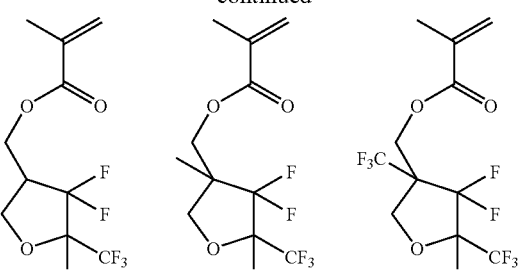

A repeating unit "b" containing a lactone, an ether group, a carbonyl group, a carbonate group, or a sulfonamide group, in addition to a hydroxyl group, a hydroxynaphthyl group, a hydroxyacenaphthyl group, a carboxy group, and a 2,2,2-trifluoro-1-hydroxyethyl group as mentioned above, may be copolymerized.

Among repeating units containing a lactone group or an ether group, a repeating unit containing a 7-oxanorbornane ring as represented by the following repeating unit (b1) or (b2) is preferably used because it undergoes a crosslinking reaction by an acid and a heat thereby expressing an effect of increasing in a mechanical strength of a film.

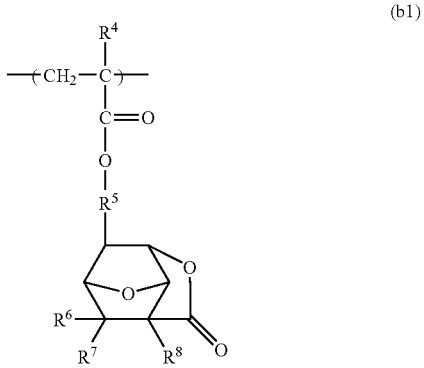

(b1)

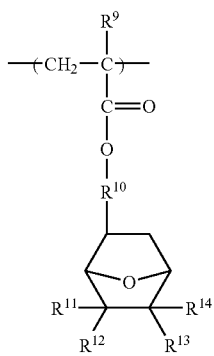
(b2)

Here, $R^4$ and $R^9$ represent a hydrogen atom or a methyl group; $R^5$ and $R^{10}$ represent a single bond, or a linear, a branched, or a cyclic alkylene group having 1 to 6 carbon atoms and optionally containing an ether group or an ester group, wherein a carbon atom directly bonded to an ester group is primary or secondary in case of a linear, a branched, or a cyclic alkylene group having 1 to 6 carbon atoms; $R^6$, $R^7$, $R^8$, $R^{11}$, $R^{12}$, $R^{13}$, and $R^{14}$ represent a hydrogen atom, or a linear, a branched, or a cyclic alkyl group having 1 to 6 carbon atoms.

Monomers to obtain a repeating unit containing a 7-oxanorbornane ring are represented by the general formulae (Mb1) or (Mb2). Here, $R^4$ to $R^{14}$ represent the same as before.

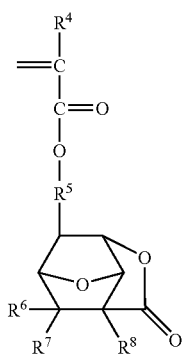
(Mb1)

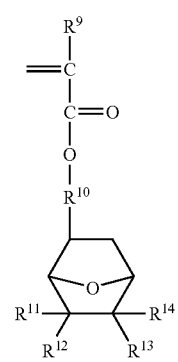
(Mb2)

Specific examples of the monomers to obtain repeating units (b1) or (b2) include following compounds.

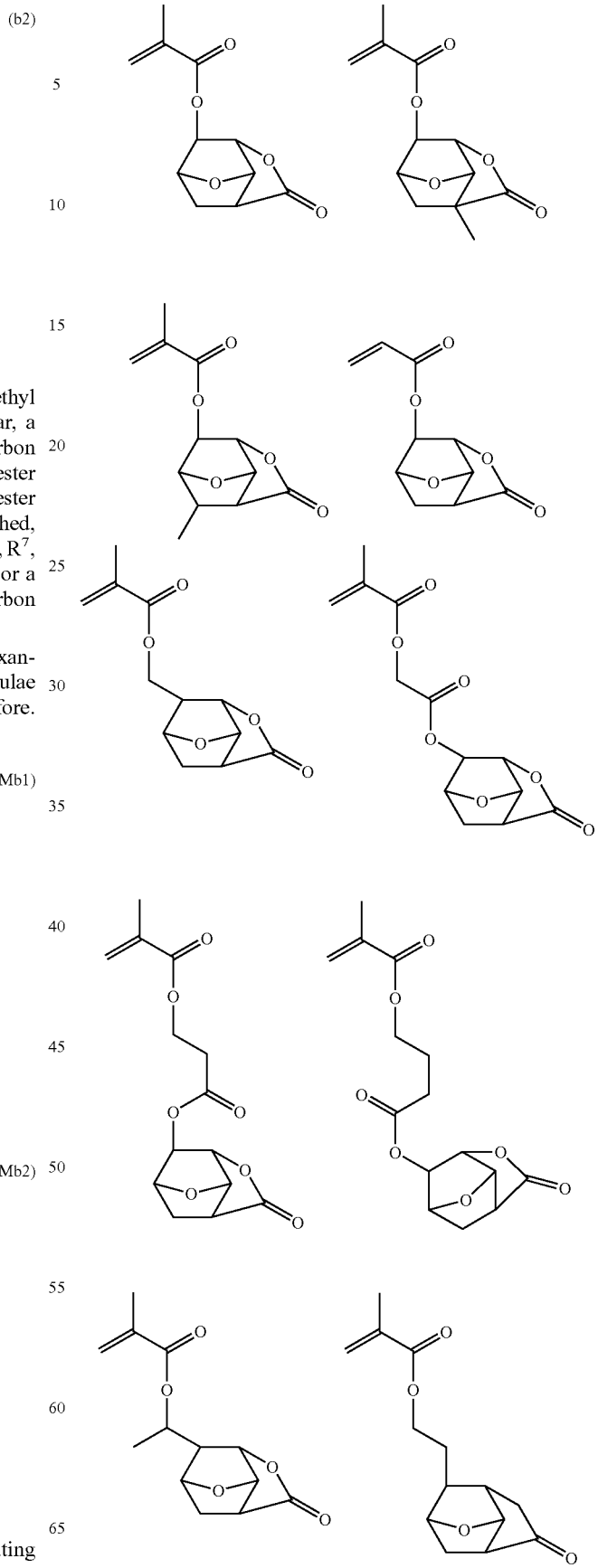

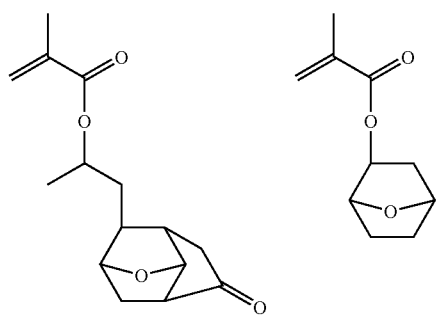
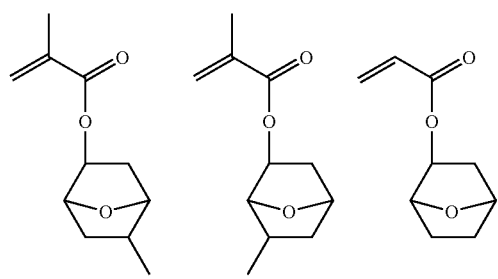
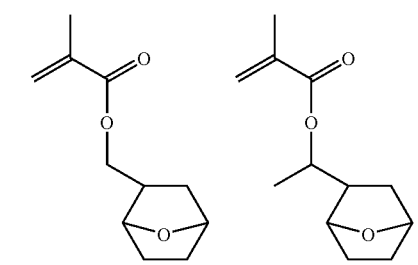
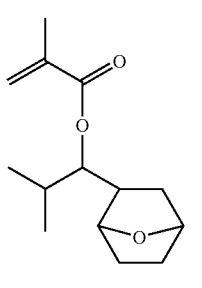
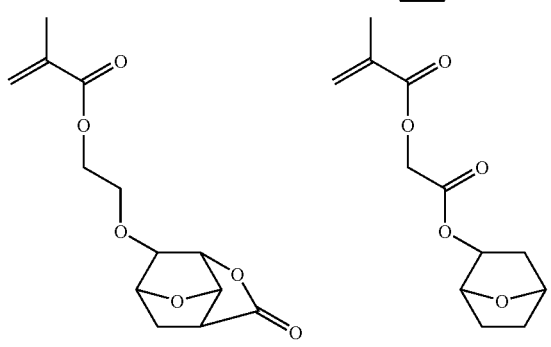
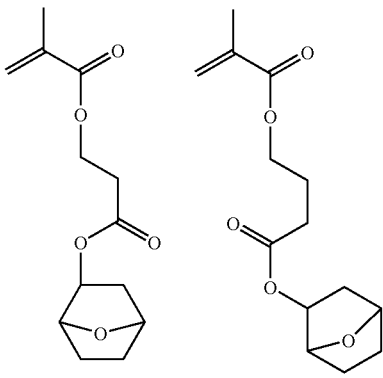
Monomers containing a lactone ring or an ether group other than (b1) and (b2) may be exemplified by following compounds.
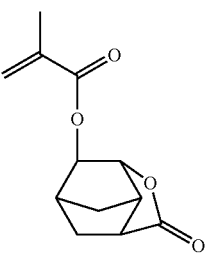
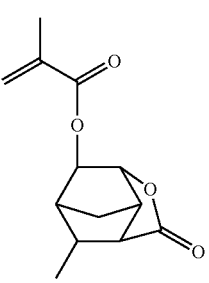
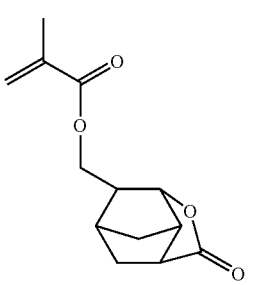

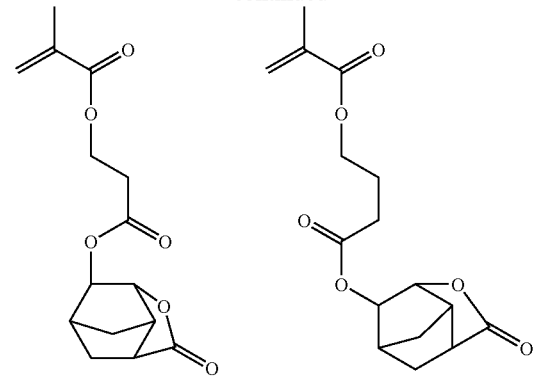
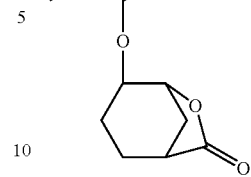
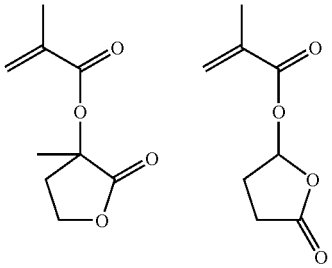
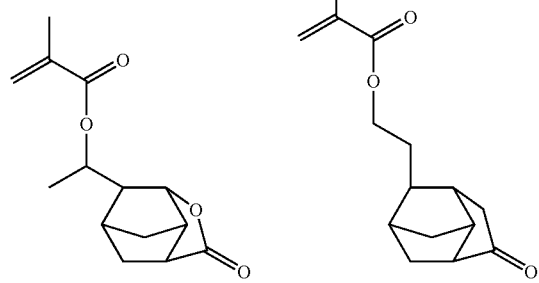
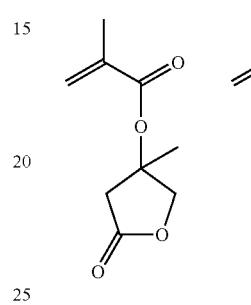
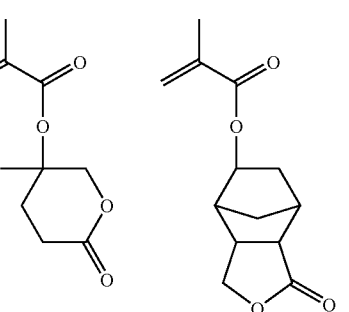
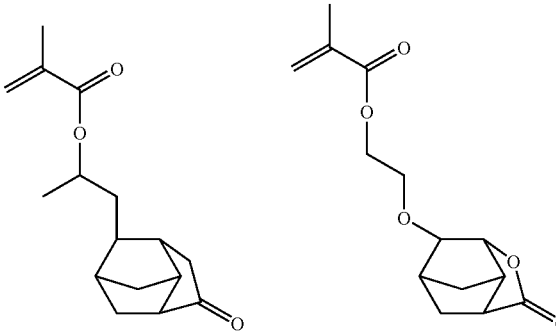
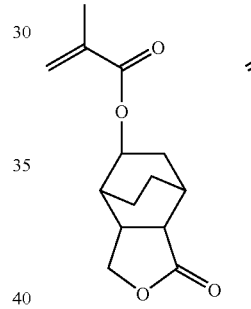
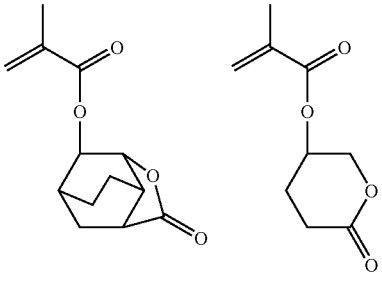
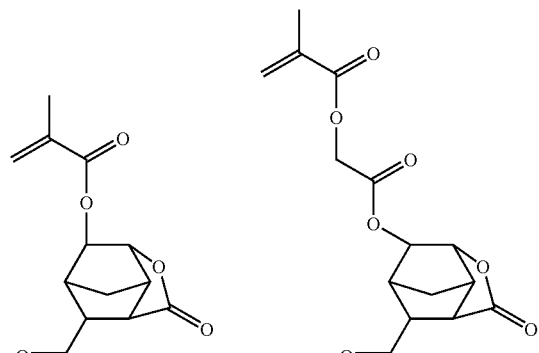
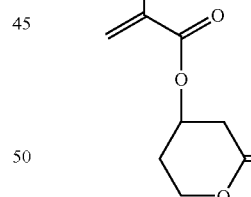
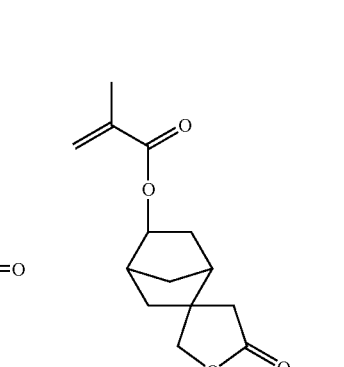
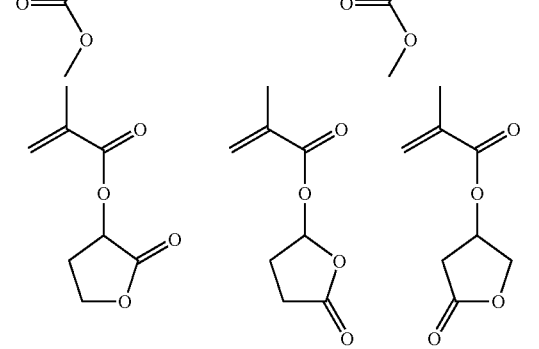
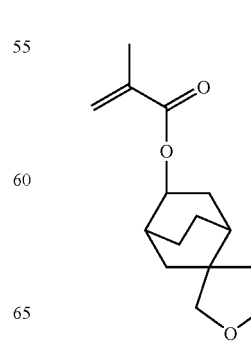
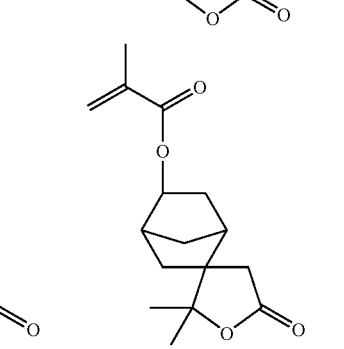

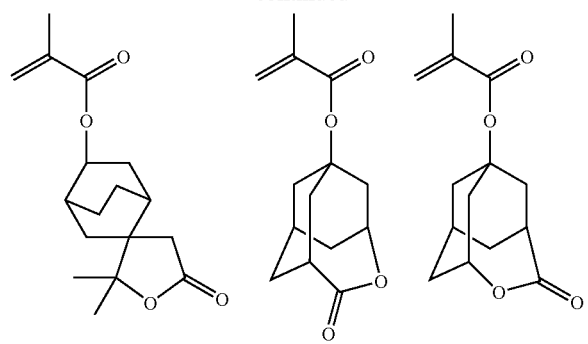
A repeating unit containing a hydroxyl group, and a lactone ring or a cyclic ether group may also be copolymerized.
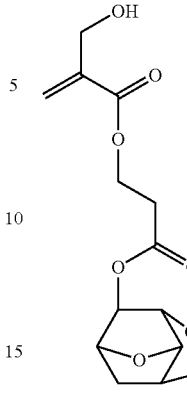
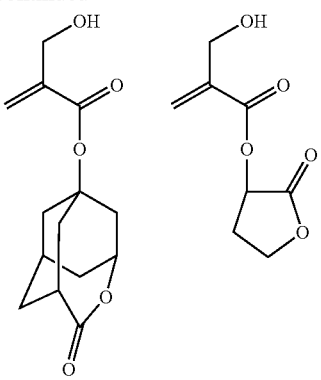
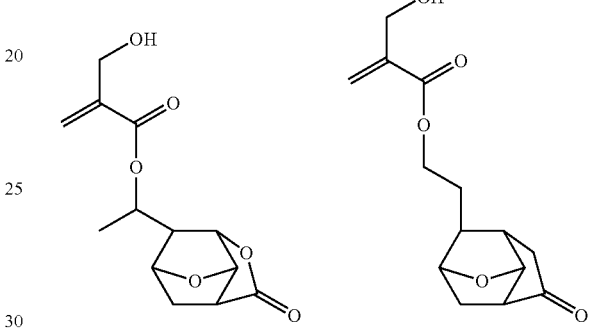
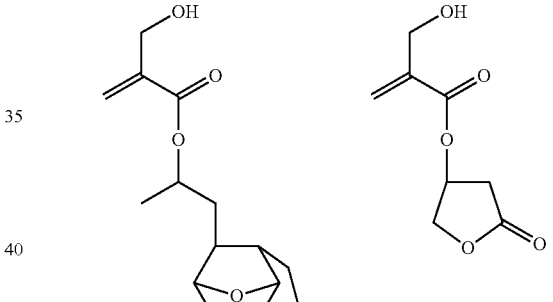
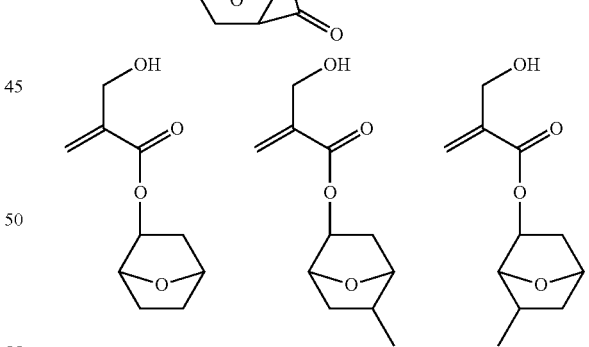

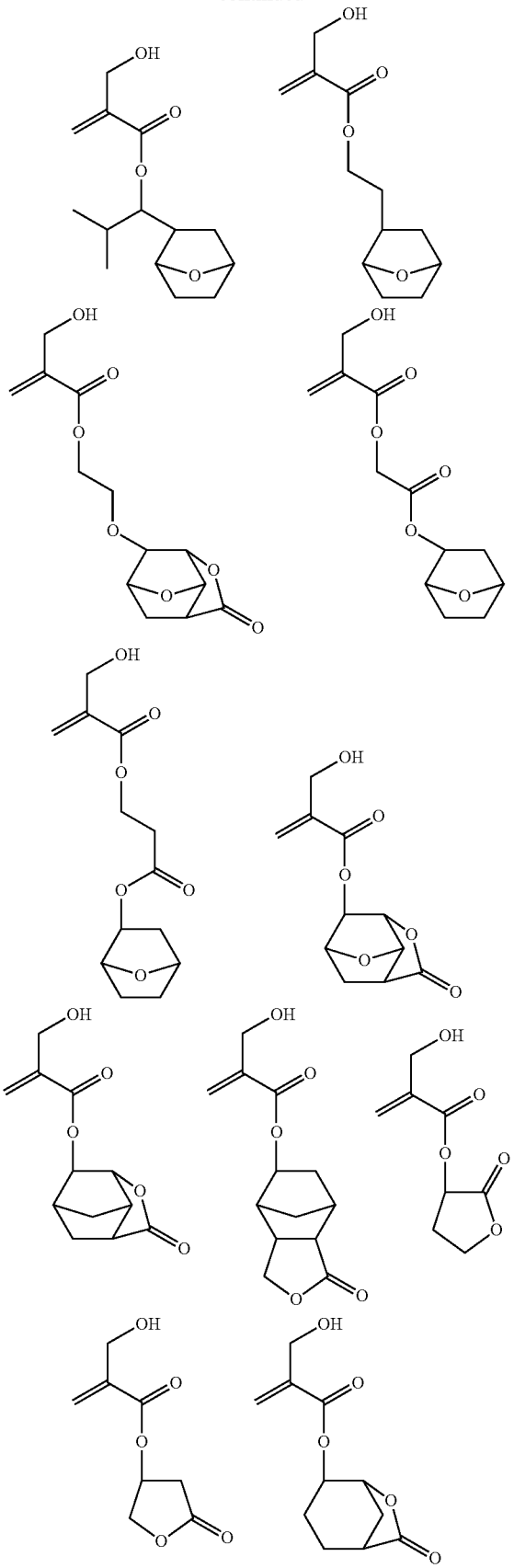
A repeating unit containing a sulfonamide may be exemplified by following compounds.
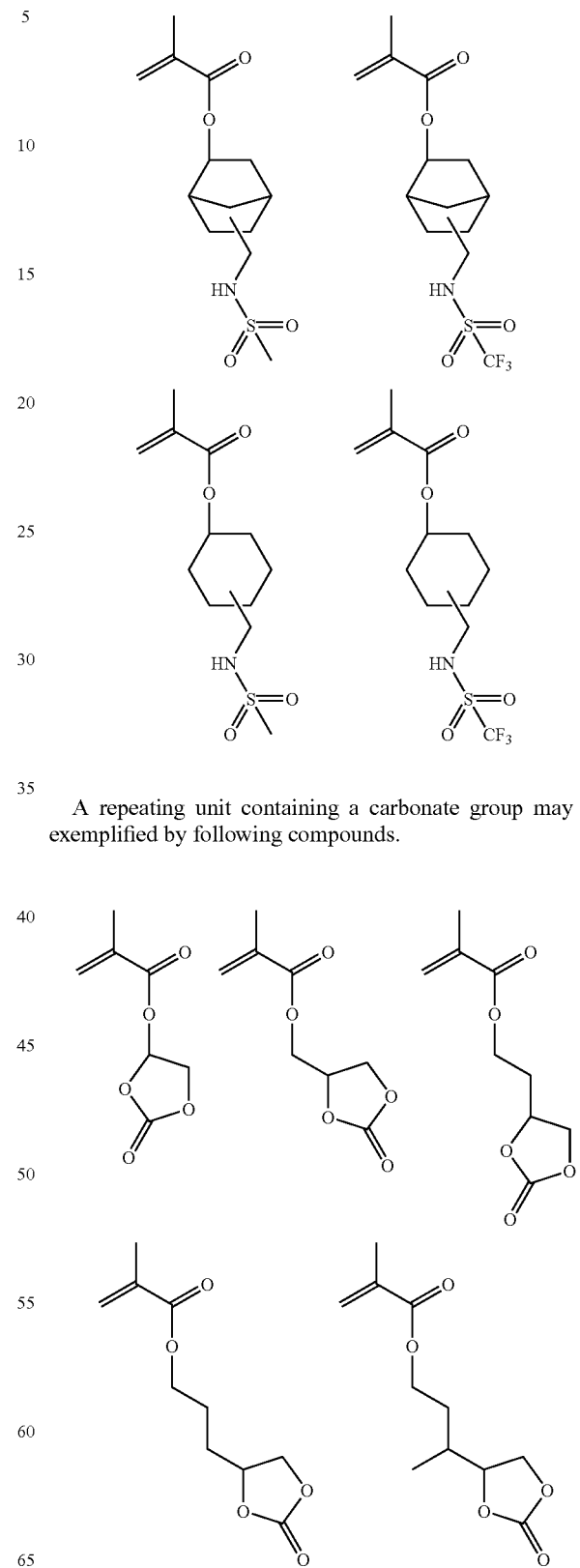
A repeating unit containing a carbonate group may be exemplified by following compounds.

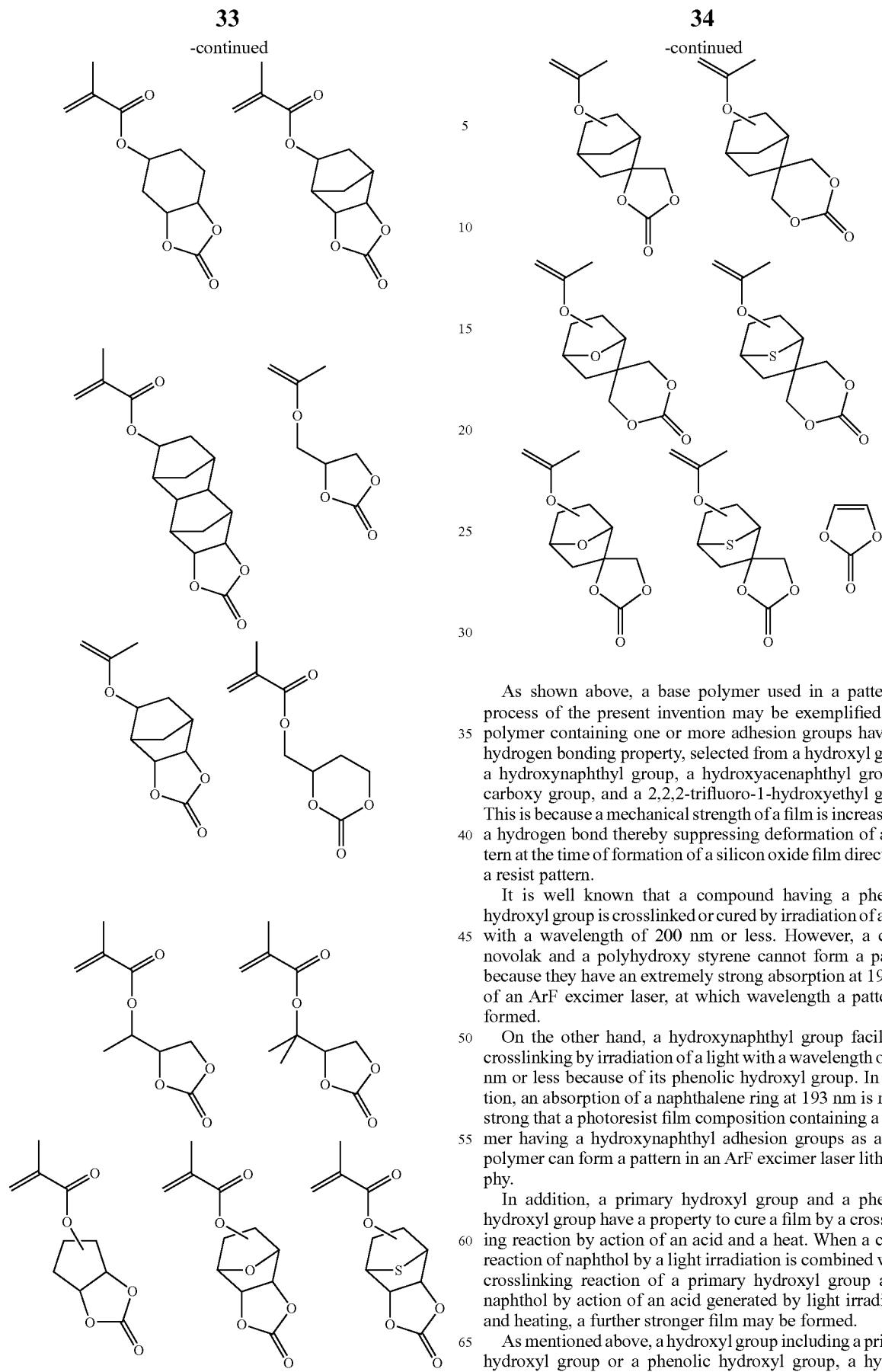

As shown above, a base polymer used in a patterning process of the present invention may be exemplified by a polymer containing one or more adhesion groups having a hydrogen bonding property, selected from a hydroxyl group, a hydroxynaphthyl group, a hydroxyacenaphthyl group, a carboxy group, and a 2,2,2-trifluoro-1-hydroxyethyl group. This is because a mechanical strength of a film is increased by a hydrogen bond thereby suppressing deformation of a pattern at the time of formation of a silicon oxide film directly on a resist pattern.

It is well known that a compound having a phenolic hydroxyl group is crosslinked or cured by irradiation of a light with a wavelength of 200 nm or less. However, a cresol novolak and a polyhydroxy styrene cannot form a pattern because they have an extremely strong absorption at 193 nm of an ArF excimer laser, at which wavelength a pattern is formed.

On the other hand, a hydroxynaphthyl group facilitates crosslinking by irradiation of a light with a wavelength of 200 nm or less because of its phenolic hydroxyl group. In addition, an absorption of a naphthalene ring at 193 nm is not so strong that a photoresist film composition containing a polymer having a hydroxynaphthyl adhesion groups as a base polymer can form a pattern in an ArF excimer laser lithography.

In addition, a primary hydroxyl group and a phenolic hydroxyl group have a property to cure a film by a crosslinking reaction by action of an acid and a heat. When a curing reaction of naphthol by a light irradiation is combined with a crosslinking reaction of a primary hydroxyl group and a naphthol by action of an acid generated by light irradiation and heating, a further stronger film may be formed.

As mentioned above, a hydroxyl group including a primary hydroxyl group or a phenolic hydroxyl group, a hydroxynaphthyl group, a hydroxyacenaphthyl group, a carboxy group, and a 2,2,2-trifluoro-1-hydroxyethyl group have a crosslinking property further, and thus, a hydroxynaphthyl group in particular can form a considerably strong film when irradiated with a 200 nm light to facilitate a crosslinking reaction.

In case of a base polymer as mentioned above and a chemically amplified positive photoresist film composition, by using a base polymer having a repeating unit containing an acid labile group, a pattern with an extremely high accuracy may be obtained by action of an acid generated from an acid generator to liberate an acid labile group at the time of exposing so that a resist part exposed to the light is made dissolved in a developer.

A base polymer to be added so that a chemically amplified positive resist composition exhibits its function contains preferably a repeating unit "c" which has an acid labile group represented by the following general formula (c1), in addition to the above-mentioned repeating units "a" and "b".

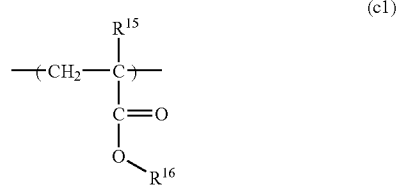

(c1)

Wherein, $R^{15}$ represents a hydrogen atom or a methyl group, and $R^{16}$ represents an acid labile group.

A monomer giving a repeating unit having an acid labile group represented by the general formula (c1) is represented by the following general formula (Mc1). Here, $R^{15}$ and $R^{16}$ represent the same as before.

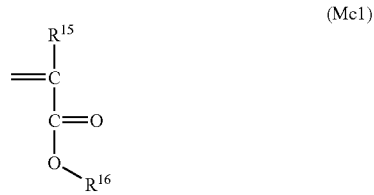

(Mc1)

An acid labile group $R^{16}$ is disclosed in paragraphs 0083-0104 of Japanese Patent Laid-Open Publication No. 2008-111103, specifically in paragraphs 0114 to 0117.

Here, a copolymerization ratio of "a", "b", and "c" is; $0<a<0.9$, $0 \leq b<0.9$, and $0<c<1.0$; preferably $0.05 \leq a \leq 0.8$, $0.1 \leq b \leq 0.8$, and $0.1 \leq c \leq 0.8$; and more preferably $0.1 \leq a \leq 0.7$, $0.2 \leq b \leq 0.7$, and $0.12 \leq c \leq 0.7$.

A polymer used as the resist base polymer used in a patterning process of the present invention is the one having a weight-average molecular weight of preferably 1,000 to 500,000, in particular 2,000 to 30,000, relative to polystyrene, as measured by a gel permeation chromatography (GPC). If the weight-average molecular weight is too small, a crosslinking efficiency is low in a thermal crosslink after development of a photoresist film, and if the weight-average molecular weight is too big, its alkali solubility decreases, possibly causing a footing phenomenon easily after pattern formation.

Further, in a polymer used as the base polymer contained in a photoresist film composition in a patterning process of the present invention, there are risks of forming foreign spots on a pattern and deterioration of a pattern profile after exposure due to presence of a high and a low molecular weight polymer if a molecular weight distribution (Mw/Mn) is wide. Accordingly, because effects of a molecular weight and a molecular-weight distribution tends to be larger as miniaturization of a pattern rule progresses, a molecular weight distribution of a multicomponents copolymer to be used is preferably in a narrow range of 1.0 to 2.0, in particular 1.0 to 1.5, in order to obtain a photoresist film composition suitably used for a fine pattern dimension.

In addition, it may be allowed to blend two or more polymers having different composition ratios, molecular weight distributions, and molecular weights.

One method for synthesizing these polymers is a thermal polymerization of a monomer containing an unsaturated bond by adding a radical polymerization initiator in an organic solvent to obtain the polymers. Examples of the organic solvent used in the polymerization include toluene, benzene, tetrahydrofurane, diethyl ether, dioxane, and the lile. Examples of the polymerization initiator include 2,2'-azobisisobutyronitrile (AIBN), 2,2'-azobis(2,4-dimethylvaleronitrile), dimethyl 2,2-azobis(2-methylpropionate), benzoyl peroxide, lauroyl peroxide, and the like. Polymerization may be carried out by heating at preferably 50 to 80° C. Reaction time is 2 to 100 hours, and preferably 5 to 20 hours. An acid labile group may be used in the form as it is introduced into a monomer, or may be once dissociated by an acid catalyst and then protected partly or totally. A polymer constituting the above-mentioned base polymer may be added not only singly but also in a combination of two or more kinds. By using a several kinds of polymers, performance of a photoresist film composition may be controlled.

A photoresist film composition used in a patterning process of the present invention may include an acid generator, for example, a compound which generates an acid by an active beam or a radiation (a photo acid generator), in order to function especially as a chemically amplified positive resist composition. Any photo acid generator may be used as far as it generates an acid by irradiation of a high energy beam. Preferable photo acid generator may be exemplified by a sulfonium salt, an iodonium salt, a sulfonyl diazomethane, an N-sulfonyl oxyimide, an oxime-O-sulfonate, and the like. They may be used singly or in a combination of two or more kinds, although the details will be described below. Specific examples of the acid generator are described in paragraphs 0122 to 0142 of Japanese Patent Laid-Open (kokai) No. 2008-111103.

Further, a thermal acid generator may be added to cure a photoresist film composition by heating after development. An acid may be generated by adding a thermal acid generator of an ammonium salt into a photoresist film composition in the amount of 0.001 to 20 parts by mass or preferably 0.01 to 10 parts by mass relative to 100 parts by mass of a base polymer in the photoresist film composition and heating the resulting mixture. Heating conditions are preferably a temperature of 100 to 300° C., in particular 130 to 250° C. and a time of 10 to 300 seconds. When a thermal acid generator as mentioned above is used, a photoresist film with an improved mechanical strength may be formed.

The thermal acid generator of the above-mentioned ammonium salt may be exemplified by the following general formula (P1a-2):

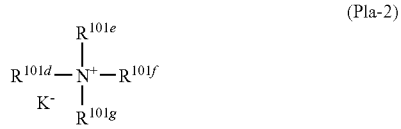

(Pla-2)

wherein, K⁻ represents a sulfonic acid group at least one of whose α-position is fluorinated, a perfluoroalkyl imidic acid, or a perfluoroalkyl methide acid; each of $R^{101d}$, $R^{101e}$, $R^{101f}$, and $R^{101g}$ represents a hydrogen atom, or a linear, a branched, or a cyclic alkyl group, an alkenyl group, an oxoalkyl group, or an oxoalkenyl group, having 1 to 12 carbon atoms, an aryl group having 6 to 20 carbon atoms, or an aralkyl or an aryoxoalkyl group having 7 to 12 carbon atoms, wherein hydrogen atoms in these groups may be substituted partly or totally by an alkoxy group; and $R^{101d}$ and $R^{101e}$, and $R^{101d}$, $R^{101e}$ and $R^{101f}$ may form a ring, and when they form a ring, $R^{101d}$ and $R^{101e}$ and $R^{101d}$, $R^{101e}$ and $R^{101f}$ are an alkylene group having 3 to 10 carbon atoms or a heteroaromatic group having a nitrogen atom shown in the formula in the ring.

Specific examples of K⁻ include a perfluoroalkane sulfonic acid such as triflate and nonaflate; an imidic acid such as bis(trifluoromethylsulfonyl)imide, bis(perfluoroethylsulfonyl)imide, and bis(perfluorobutylsulfonyl)imide; a methide acid such as tris(trifluoromethylsulfonyl)methide and tris(perfluoroethylsulfonyl)methide; a sulfonate whose α-position is substituted by fluorine atoms as shown in the following general formula (K-1); and a sulfonate whose α-position is substituted by fluorine atoms as shown in the following general formula (K-2).

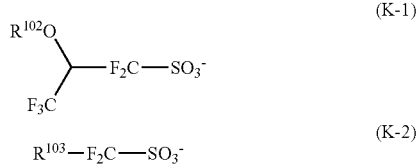

In the general formula (K-1), $R^{102}$ represents a hydrogen atom, or a linear, a branched, or a cyclic alkyl or acyl group having 1 to 20 carbon atoms, an alkenyl group having 2 to 20 carbon atoms, or an aryl or an aryloxy group having 6 to 20 carbon atoms, wherein they may optionally contain an ether group, an ester group, a carbonyl group, or a lactone ring, or hydrogen atoms in these groups may be partly or totally substituted by a fluorine atom. In the general formula (K-2), $R^{103}$ represents a hydrogen atom, or a linear, a branched, or a cyclic alkyl group having 1 to 20 carbon atoms, an alkenyl group having 2 to 20 carbon atoms, or an aryl group having 6 to 20 carbon atoms.

A photoresist film composition in the present invention may further contain any one or more of substances selected from an organic solvent, a basic compound, a dissolution inhibitor, a surfactant, and acetylene alcohols.

Specifically, Japanese Patent Laid-Open (kokai) No. 2008-111103 describes the organic solvent in its paragraphs of 0144 to 0145, the basic compound in its paragraphs 0146 to 0164, and the surfactant in its paragraphs 0165 to 0166. Japanese Patent Laid-Open (kokai) No. 2008-122932 describes the dissolution inhibitor in its paragraphs 0155 to 0178, and the acetylene alcohols in its paragraphs 0179 to 0182.

When a photoresist pattern, having the hardness of 0.4 GPa or more or the Young's modulus of 9.2 GPa or more as the film strength, obtained from the photoresist film composition as mentioned above or in a certain case by light irradiation or heat treatment after development, is used, a deformation of the photoresist pattern and an increase in LWR may be avoided in a subsequent step to form a silicon oxide film on the photoresist pattern sidewall as a spacer. Hereinafter, a patterning process of the present invention using the photoresist film composition as mentioned above will be described in detail. In FIG. 1, a process flow chart of the present invention is illustrated, and the process will be explained below.

In the present invention, on substrate 1 is formed a processing layer 2, on which a carbon film 3 is formed. On it the photoresist film as mentioned above is formed, and then a photoresist pattern 4 is formed after exposure and development (FIG. 1-1). On the photoresist pattern (4) sidewall, a silicon oxide film 5 is formed by a chemical vapor deposition method and the like (FIG. 1-2). The silicon oxide film in the photoresist upper part 7 and in the space part 6 is removed to form a spacer 8 (FIG. 1-3). The carbon film 3 is processed with a mask of the spacer 8 (FIG. 1-4). The processing layer 2 is processed with a mask of the processed carbon 3' to obtain a processed layer 2' (FIG. 1-5). The obtained pattern is the same as the pattern formed by a conventional spacer line method in FIG. 3 in which a silicon oxide film is formed directly on a hard mask, but the patterning process of the present invention is shorter in the process steps than a conventional spacer line method as a step of hard mask etching is omitted.

In the present invention, a silicon substrate is generally used as the substrate. A processing layer formed on the substrate may be exemplified by a layer of $SiO_2$, SiN, SiON, SiOC, p-Si, α-Si, TiN, WSi, BPSG, SOG, Cr, CrO, CrON, or MoSi, a low dielectric film, and its etching stopper film. They are different from those used in a photoresist film.

In the present invention, it is preferable to form a carbon film on a processing layer. This carbon film may be formed by a CVD method or a spin coat method. Carbon content in the carbon film is 75% or more by weight, preferably 80% or more by weight, and more preferably 85% or more by weight. In U.S. Pat. No. 3,504,247, a patterning process by a three-layer resist process using an underlayer film with a carbon content of 80% or more is described. By using an underlayer film with a high carbon density, a processing layer may be etched with a small deformation and dimensional change in pattern of an underlayer film during etching. In a patterning process of the present invention, an improvement in dimensional controllability during etching of a processing layer may be expected due to an underlayer film with a high carbon density. A carbon film by a spin coat method is described in U.S. Pat. No. 3,981,825, Japanese Patent Laid-Open (kokai) No. 2005-128509, Japanese Patent Laid-Open (kokai) No. 2006-293298, and Japanese Patent Laid-Open (kokai) No. 2007-199653.

An organic anti-reflection film may be made between a carbon film and a resist film. Many of carbon film have a k-value of 0.3 or more at a wavelength of 193 nm, and thus the substrate reflection from a carbon film to a resist film exceeds 1%. A substrate with a substrate reflectance of 1% or more deteriorates a resist profile due to standing wave radiation, thereby deteriorating a dimensional homogeneity. To control the substrate reflectance rate at 1% or less, formation of an organic anti-reflection film with the k-value controlled at 0.05 to 0.2 between a carbon film and a resist film is effective. An anti-reflection effect by the bilayer anti-reflection film formed of a carbon film and an organic anti-reflection film is excellent, and thus the substrate reflectance may be controlled at 1% or less even in an immersion lithography using NA of 1.0 or more with a large incidence angle and a high reflectance.

Thickness of the resist film is preferably 10 to 1,000 nm, in particular 20 to 500 nm. The resist film is pre-baked before exposure at a temperature of preferably 60 to 180° C., in particular 70 to 150° C., and a time of preferably 10 to 300 seconds, in particular 15 to 200 seconds.

Exposure is made by a high energy beam with 140 to 250 nm wavelength, most preferably by an ArF excimer laser with 193 nm. Exposure may be made under dry atmosphere of an air or a nitrogen stream. An immersion exposure in water may also be used. In an ArF immersion lithography, a liquid such as pure water and an alkane which has a refractive index of 1 or more and is transparent at the wavelength of an exposure beam is used. In an immersion lithography, pure water or other liquid is introduced between a resist film after pre-bake and a projector lens. With this, a lens with NA of 1.0 or more may be designed, thereby enabling to form further finer pattern. An immersion lithography is an important technology to prolong the life of an ArF lithography until a 45-nm node. In an immersion exposure, a rinse by pure water (post-soak) may be done after exposure to remove water droplets remained on a resist film. In order to avoid drainage from a resist film thereby improving a water sliding property on the film surface, a top coat may be formed on the resist film after pre-bake. A resist top coat used in an immersion lithography technology is made of preferably a composition containing, for example, a base polymer having a 1,1,1,3,3,3-hexafluoro-2-propanol moiety which is not soluble in water and soluble in an alkaline developer, wherein the polymer is dissolved in an alcoholic solvent having 4 or more carbon atoms, an ether solvent having 8 to 12 carbon atoms, and a mixed solvent thereof. After formation of a photoresist film, a rinse by pure water (post-soak) may be done to extract an acid generator from the film surface or to wash out particles; or after exposure, a rinse (post soak) may be done to remove water remained on the film.

An exposure dose in exposure is about 1 to 200 mJ/cm$^2$, and preferably about 10 to 100 mJ/cm$^2$. A post-exposure bake (PEB) is done at 60 to 150° C. for 1 to 5 minutes, and preferably at 80 to 120° C. for 1 to 3 minutes, on a hot plate.

Development is done in an aqueous alkaline developer such as tetramethyl ammonium hydroxide (TMAH) with a concentration of 0.1 to 5% by mass and preferably 2 to 3% by mass, and a time for 0.1 to 3 minutes and preferably for 0.5 to 2 minutes, by a conventional method such as a dip method, a puddle method, and a spray method. With this, an intended pattern may be formed on a substrate.

Curing of a resist pattern after development is done by a heat treatment or irradiation of a light with a wavelength of 320 nm or less, thereby leading to increase in film strength. A heat treatment facilitates a crosslinking reaction. Irradiation after development is done by a high energy beam with a wavelength of 320 nm or less. Specifically, a KrB excimer beam with a wavelength of 206 nm, a KrCl excimer beam with a wavelength of 222 nm, a KrF excimer beam with a wavelength of 248 nm, a XeBr excimer beam with a wavelength of 283 nm, a XeCl excimer beam with a wavelength of 308 nm, a low-pressure mercury vapor lamp, a high-pressure mercury vapor lamp, and a metal halide lamp with wavelengths including 254 nm, an ArF excimer beam with a wavelength of 193 nm, a Xe$_2$ excimer beam with a wavelength of 172 nm, a F$_2$ excimer beam with a wavelength of 157 nm, a Kr$_2$ excimer beam with a wavelength of 146 nm, and an Ar$_2$ excimer beam with a wavelength of 126 nm are preferable.

The exposure dose is 10 mJ/cm$^2$ to 10 J/cm$^2$ in case of a light. Irradiation of a light with a wavelength of 200 nm or less, especially an excimer laser and an excimer lamp with wavelengths of 193 nm, 172 nm, 157 nm, 146 nm, and 122 nm not only generate an acid from a photo acid generator but also facilitate a crosslinking reaction by light irradiation.

A high-pressure mercury vapor lamp radiates emission lines of 254 nm, 264 nm, 291 nm, 297 nm, 302 nm, 313 nm, 365 nm, 405 nm, 436 nm, 546 nm, and 577 nm wavelengths. Decomposition of an acid generator contained in a photoresist is small by irradiation of a light with a wavelength longer than 365 nm, and thus exposure of a light with a wavelength shorter than 320 nm is effective. A light with a wavelength longer than 320 nm may be cut by installing a filter or a mirror, or a light with a wavelength 320 nm or longer may not be cut. A metal halide lamp does not radiate a spectrum with a high brightness like a high-pressure mercury vapor lamp but radiates a UV beam with broad and continuous wavelengths, and there is no need to cut a light of long wavelengths, not likely in the case of a high-pressure mercury lamp. A high-pressure mercury lamp and a metal halide lamp have merits in that they are cheap, have a high light intensity, and radiate a light of multiwavelength without standing wave radiation, and thus acid generation and curing may be done evenly in a pattern film direction.

Meanwhile, when irradiation of a light with a wavelength of 180 nm or less is done in an air, a resist surface is oxidized by ozone thereby generated, resulting in a significant reduction in film thickness. Ozone oxidation by light irradiation is used to clean an organic substance attached on a substrate, and thus a resist film is also cleaned by ozone, thereby leading to loss of the film if exposure dose is too large. Accordingly, if irradiation is done by an excimer laser or an excimer lamp with a wavelength of 172 nm, 157 nm, 146 nm, and 122 nm, it is preferable to purge by an inert gas such as nitrogen, helium, argon, and krypton, then, irradiate by light under atmosphere with concentration of an oxygen gas and water in it being 10 ppm or less.

Mechanical strength of a resist film may be measured preferably by a nanoindenter method. Strength of a thin film is obtained from a load applied to a pressure piece, having a shape of an equilateral trigonal pyramid formed of a diamond chip, pressed onto a thin film in a nanoindenter. Strength of a resist film is measured for a film, formed by applying a resist solution to a Si substrate, with a thickness after pre-bake being 200 to 1,000 nm. Patterning of a resist is done with a film thickness of about 100 nm. If a film is too thin, information on substrate strength affects the film, and thus an inherent strength of the film to be measured cannot be obtained. Accordingly, strength is measured for a thicker film than that in patterning.

The present invention proposes a patterning process in which a silicon oxide film is made on a photoresist pattern having the hardness of 0.4 GPa or more or the Young's modulus of 9.2 GPa or more as the film thickness by a CVD (Chemical Vapor Deposition) method or an ALD (Atomic layer Deposition) method.

Formation of a silicon oxide film by a CVD method or an ALD method is preferably performed at a temperature equal to or lower than a glass transition temperature (Tg) of a base polymer contained in a photoresist film composition, because a silicon oxide film can be formed directly on a photoresist without a significant deformation of a photoresist pattern. Film formation by an ALD method is disclosed in Japanese Patent Laid-Open (kokai) No. 2005-197561, Applied Surface Science 82/83 (1994), p. 460-467, and Applied Surface Science 130-132 (1998), p. 202-207. A film of various kinds of metal oxides and metal nitrides such, as $SiO_2$, SiN, $HfO_2$, and $Al_2O_3$, may be formed. In particular, a film of $SiO_2$ may be formed at a low temperature, near 100° C. When forming a $SiO_2$ film, a silane gas is charged and a silane monomer is adsorbed onto a photoresist film, and then silicon is oxidized by a plasma-exited oxidizing gas. This adsorption and oxidation of a silane is repeated so that an oxidized silicon molecule is deposited one by one for growing. As the silane gas, a chlorosilane gas, an alkoxy silane gas, an isocyanate silane gas, and the like are preferably used. As the oxidizing gas, an oxygen, water, and ozone are used, wherein they may be used as a mixture of them or a mixture with an inert gas such as $N_2$, Ar, and He. In each step, an inert gas such as $N_2$, Ar, and He may be flowed to purge a remaining gas. In order to suppress deformation of a resist pattern, temperature of a substrate is 200° C. or lower, preferably 150° C. or lower, and more preferably 130° C. or lower.

EXAMPLE

Hereinafter, the present invention will be described specifically by Examples and Comparative Examples, but the present invention is not restricted by Examples and the like described hereinafter. Here, a weight-average molecular weight is an equivalent weight-average molecular weight relative to polystyrene measured by GPC.

Synthesis Examples of Base Polymers

A base polymer added in a photoresist film composition was obtained as following; each monomer as shown below was combined and copolymerized in tetrahydrofurane as a solvent, and a resulting product was crystallized out in methanol, washed repeatedly with hexane, isolated, and dried to obtain a copolymer (base polymer) with a composition as shown below (polymers 1 to 9 and comparative polymers 1 and 2). Composition of an obtained base polymer was determined by $^1$H-NMR, and a molecular weight (weight average molecular weight) and a dispersivity (molecular weight distribution) were obtained by a gel permeation chromatography.

Polymer 1
  Molecular weight (Mw): 8,100
  Dispersivity (Mw/Mn): 1.77

Polymer 2
  Molecular weight (Mw): 8,800
  Dispersivity (Mw/Mn): 1.77

Polymer 3
  Molecular weight (Mw): 7,500
  Dispersivity (Mw/Mn): 1.82

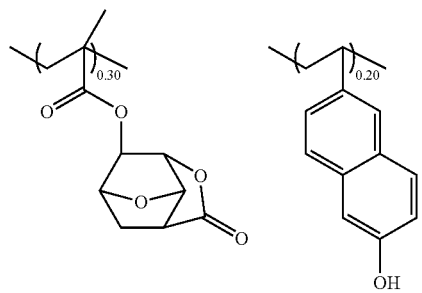

Polymer 2

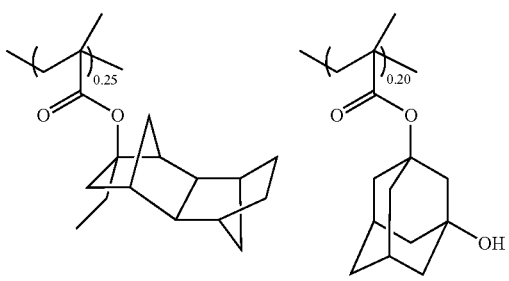

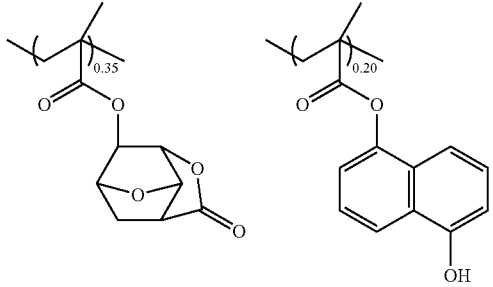

Polymer 3

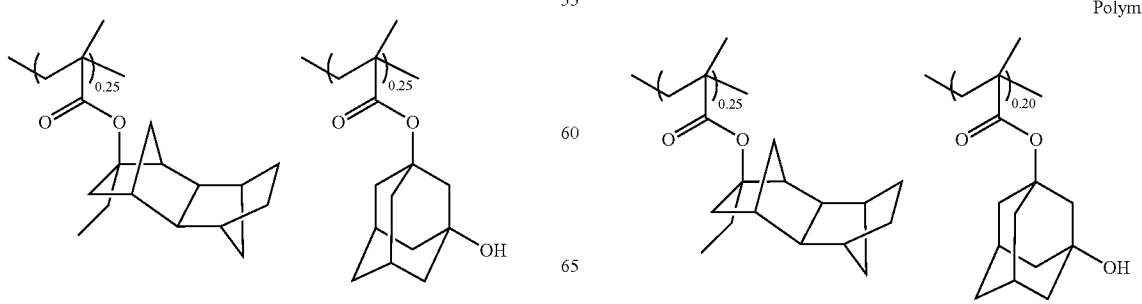

Polymer 1

-continued
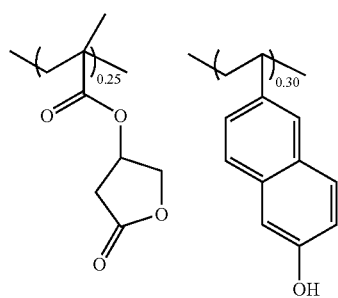
Polymer 4
  Molecular weight (Mw): 8,100
  Dispersivity (Mw/Mn): 1.94
Polymer 4
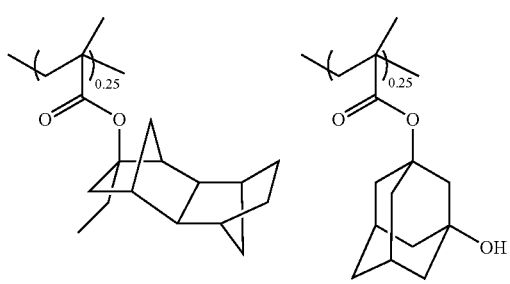
Polymer 5
  Molecular weight (Mw): 7,800
  Dispersivity (Mw/Mn): 1.55
Polymer 5
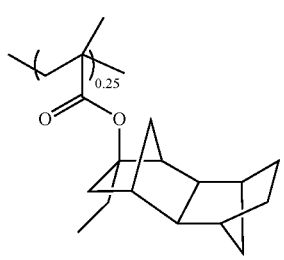
-continued
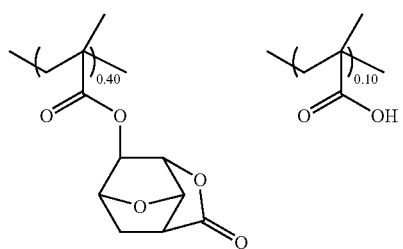
Polymer 6
  Molecular weight (Mw): 7,200
  Dispersivity (Mw/Mn): 1.75
Polymer 6
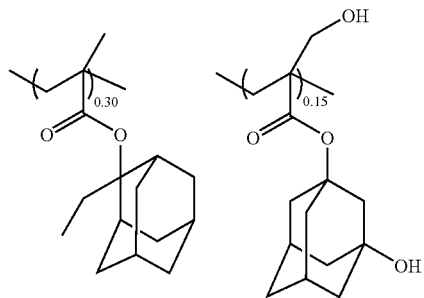
Polymer 7
  Molecular weight (Mw): 7,700
  Dispersivity (Mw/Mn): 1.71
Polymer 7
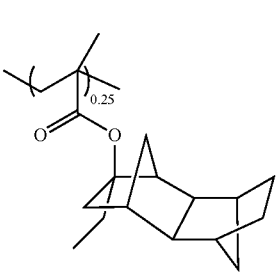

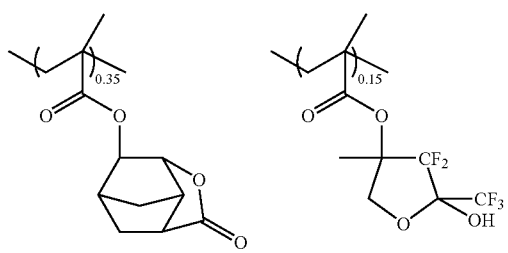
Polymer 8
Molecular weight (Mw): 8,500
Dispersivity (Mw/Mn): 1.90
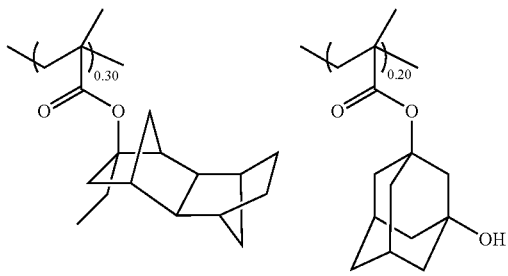
Polymer 8
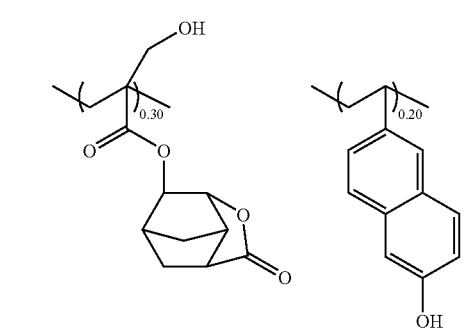
Polymer 9
Molecular weight (Mw): 6,300
Dispersivity (Mw/Mn): 1.69
Polymer 9
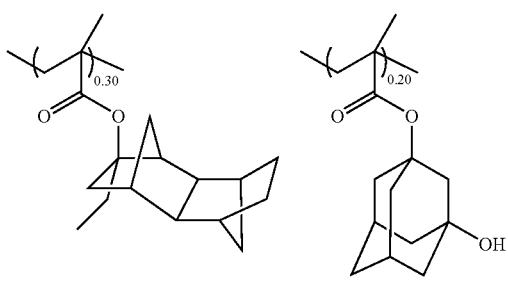
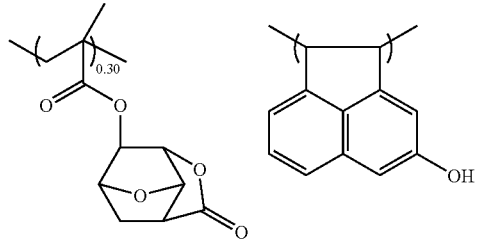
Comparative Polymer 1
Molecular weight (Mw): 8,900
Dispersivity (Mw/Mn): 1.86
Comparative Polymer 1
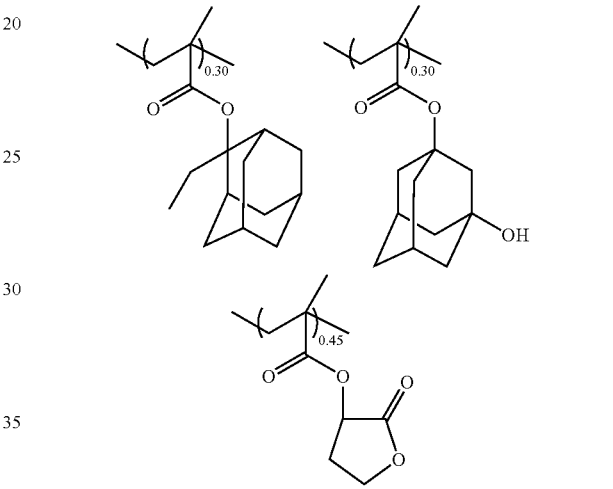
Comparative Polymer 2
Molecular weight (Mw): 8,300
Dispersivity (Mw/Mn): 1.83
Comparative Polymer 2
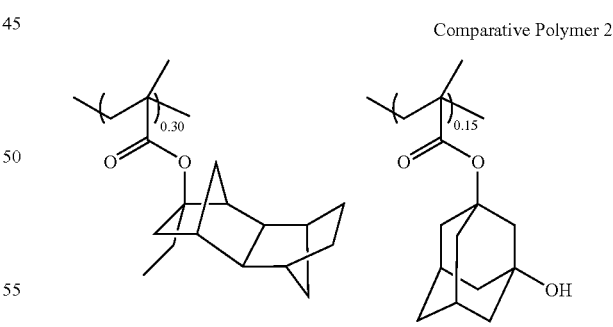

Examples 1-15, and Comparative Examples 1 and 2

Preparation of Positive Resist Compositions

A solution containing a base polymer synthesized as mentioned above (polymers 1 to 9 and comparative polymers 1 and 2) with a composition as shown in Table 1 was filtered through a filter with a size of 0.2 μm to obtain a resist solution.

An acid generator, a basic compound, and an organic solvent added in each resist film composition shown in Table 1 are as following:

Acid generator: PAG 1, PAG 2, and TAG (see the following formulae)

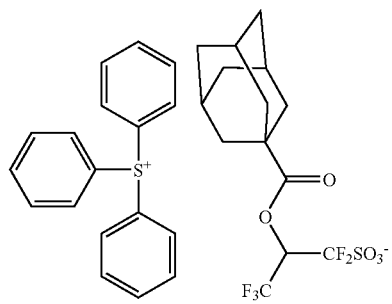

PAG 1

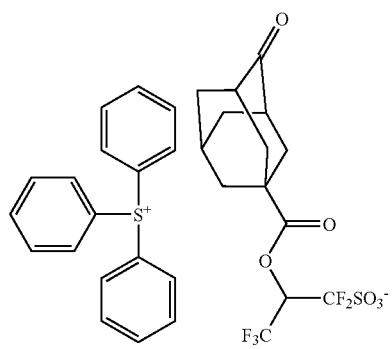

PAG 2

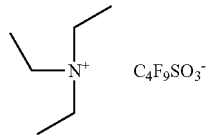

TAG

Basic compound: Quencher 1 (see the following formula)

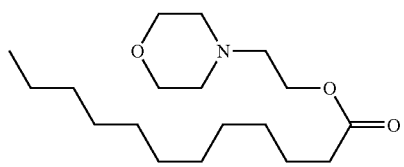

Quencher 1

Organic solvent: PGMEA (propyleneglycol monomethyl ether acetate) and CyH (cyclohexanone)

(Measurement of Film Strength)

Each resist film composition of Examples 1 to 15 and Comparative Examples 1 and 2 shown in Table 1 was applied on a Si wafer which was prime-treated by a vapor of hexamethyl disilazane, and then baked at 110° C. for 60 seconds. With this, a film having a thickness of 250 nm was obtained.

In Example 9, irradiation was made by an ArF excimer laser with an energy amount of 100 mJ/cm$^2$, and baking was done at 200° C. for 60 seconds. In Examples 10 and 11, baking was done at 200° C. for 60 seconds. In Example 13, irradiation was made by a KrF excimer laser with an energy amount of 100 mJ/cm$^2$, and baking was done at 200° C. for 60 seconds. In Example 14, irradiation was made by a 100-W high-pressure mercury vapor lamp for 10 seconds, and baking was done at 200° C. for 60 seconds. In Example 15, irradiation was made by a 100-W metal halide lamp for 10 seconds, and baking was done at 200° C. for 60 seconds. Measurements were made with a nanoindenter SA 2 (manufactured by MTS Systems Corporation).

TABLE 1

| | Polymer (mass parts) | Acid generator (mass parts) | Basic compound (mass parts) | Organic solvent (mass parts) | Young's modulus (GPa) | Hardness (GPa) |
|---|---|---|---|---|---|---|
| Example 1 | Polymer 1 (100) | PAG 1 (14.0) | Quencher 1 (1.60) | PGMEA (700) CyH (300) | 10.9 | 0.48 |
| Example 2 | Polymer 2 (100) | PAG 1 (14.0) | Quencher 1 (1.60) | PGMEA (700) CyH (300) | 10.2 | 0.46 |
| Example 3 | Polymer 3 (100) | PAG 1 (14.0) | Quencher 1 (1.60) | PGMEA (700) CyH (300) | 9.5 | 0.42 |
| Example 4 | Polymer 4 (100) | PAG 1 (14.0) | Quencher 1 (1.60) | PGMEA (700) CyH (300) | 10.0 | 0.43 |
| Example 5 | Polymer 5 (100) | PAG 1 (14.0) | Quencher 1 (1.60) | PGMEA (700) CyH (300) | 10.2 | 0.45 |
| Example 6 | Polymer 6 (100) | PAG 1 (14.0) | Quencher 1 (1.60) | PGMEA (700) CyH (300) | 10.4 | 0.45 |
| Example 7 | Polymer 7 (100) | PAG 2 (14.0) | Quencher 1 (1.60) | PGMEA (700) CyH (300) | 10.1 | 0.44 |

TABLE 1-continued

| | Polymer (mass parts) | Acid generator (mass parts) | Basic compound (mass parts) | Organic solvent (mass parts) | Young's modulus (GPa) | Hardness (GPa) |
|---|---|---|---|---|---|---|
| Example 8 | Polymer 8 (100) | PAG 2 (14.0) | Quencher 1 (1.60) | PGMEA (700) CyH (300) | 10.8 | 0.47 |
| Example 9 | Polymer 1 (100) | PAG 1 (14.0) | Quencher 1 (1.60) | PGMEA (700) CyH (300) | 13.1 | 0.65 |
| Example 10 | Polymer 1 (100) | PAG 1 (14.0) | Quencher 1 (1.60) | PGMEA (700) CyH (300) | 12.0 | 0.55 |
| Example 11 | Polymer 1 (100) | PAG 1 (14.0) TAG(1.0) | Quencher 1 (1.60) | PGMEA (700) CyH (300) | 12.2 | 0.57 |
| Example 12 | Polymer 9 (100) | PAG 2 (14.0) | Quencher 1 (1.60) | PGMEA (700) CyH (300) | 11.1 | 0.52 |
| Example 13 | Polymer 9 (100) | PAG 2 (14.0) | Quencher 1 (1.60) | PGMEA (700) CyH (300) | 15.5 | 0.76 |
| Example 14 | Polymer 9 (100) | PAG 2 (14.0) | Quencher 1 (1.60) | PGMEA (700) CyH (300) | 15.8 | 0.78 |
| Example 15 | Polymer 9 (100) | PAG 2 (14.0) | Quencher 1 (1.60) | PGMEA (700) CyH (300) | 15.1 | 0.77 |
| Comparative Example 1 | Comparative polymer 1 (100) | PAG 1 (14.0) | Quencher 1 (1.60) | PGMEA (700) CyH (300) | 9.0 | 0.36 |
| Comparative Example 2 | Comparative polymer 2 (100) | PAG 1 (14.0) | Quencher 1 (1.60) | PGMEA (700) CyH (300) | 9.1 | 0.39 |

For a carbon underlayer, ODL-50 (manufactured by Shin-Etsu Chemical Co., Ltd.) was applied on a Si wafer by a spin coat method, and baked at 300° C. for 60 seconds to obtain a carbon film with a thickness of 200 nm. Elemental analysis of the underlayer revealed that the content of a carbon was 80.5% by weight. The elemental analysis was made by a flash combustion frontal chromatography method (TCD) under an oxygen flow. An organic anti-reflection film material ARC-29A (manufactured by Nissan Chemical Industries, Ltd.) was applied on it, and baked at 200° C. for 60 seconds to obtain an anti-reflection film with a thickness of 80 nm as a substrate.

A resist film composition prepared by Examples 1 to 15 and Comparative Examples 1 and 2 in Table 1 was applied on the substrate by a spin coat method, and baked at 110° C. for 60 seconds on a hot plate to obtain a resist film with a thickness of 120 nm.

This was exposed by using an ArF excimer laser scanner (NSR-S307E with NA 0.85, a 0.93/0.69, and 20 degree dipole illumination, and 6% half tone phase shift mask, manufactured by Nikon Corporation). Immediately after the exposure, it was baked at 100° C. for 60 seconds, and then developed in an aqueous tetramethyl ammonium hydroxide solution (concentration of 2.38% by mass) for 30 seconds to obtain a positive pattern with a size of 50 nm and a pitch of 130 nm. A photoresist pattern formed by using a resist film prepared in Example 9 was irradiated by an ArF excimer laser with an energy dose of 100 mJ/cm$^2$, and baked at 200° C. for 60 seconds. Each photoresist pattern formed by using a resist film prepared in Examples 10 and 11 was baked at 200° C. for 60 seconds. A photoresist pattern formed by using a resist film prepared in Example 13 was irradiated by a KrF excimer laser with an energy dose of 100 mJ/cm$^2$, and baked at 200° C. for 60 seconds. A photoresist pattern formed by using a resist film prepared in Example 14 was irradiated by a 100-W high-pressure mercury vapor lamp for 10 seconds, and baked at 200° C. for 60 seconds. A photoresist pattern formed by using a resist film prepared in Example 15 was irradiated by a 100-W metal halide lamp for 10 seconds, and baked at 200° C. for 60 seconds.

On a photoresist pattern as mentioned above, a silicon oxide film with a thickness of 30 nm was formed by using ALDINNA (registered trade mark), a batch type ALD instrument, manufactured by Hitachi Kokusai Electric, Inc.). A pattern roughness (LWR) before and after formation of a silicon oxide film was measured by S-9380 (critical dimension SEM, manufactured by Hitachi High-Technologies Corporation), and the results are shown in Table 2. When a silicon oxide film is formed on a photoresist pattern having the harness of 0.4 GPa or more or the Young's modulus of 9.2 GPa or more, as disclosed in the present invention, the effect of decreasing in roughness was observed.

TABLE 2

| | Polymer (mass parts) | Acid generator (mass parts) | Basic compound (mass parts) | Organic solvent (mass parts) | LWR after development (nm) | LWR after ALD (nm) |
|---|---|---|---|---|---|---|
| Example 1 | Polymer 1 (100) | PAG 1 (14.0) | Quencher 1 (1.60) | PGMEA (1500) CyH (500) | 4.1 | 3.9 |
| Example 2 | Polymer 2 (100) | PAG 1 (14.0) | Quencher 1 (1.60) | PGMEA (1500) CyH (500) | 4.0 | 3.8 |
| Example 3 | Polymer 3 (100) | PAG 1 (14.0) | Quencher 1 (1.60) | PGMEA (1500) CyH (500) | 3.8 | 4.0 |

TABLE 2-continued

| | Polymer (mass parts) | Acid generator (mass parts) | Basic compound (mass parts) | Organic solvent (mass parts) | LWR after development (nm) | LWR after ALD (nm) |
|---|---|---|---|---|---|---|
| Example 4 | Polymer 4 (100) | PAG 1 (14.0) | Quencher 1 (1.60) | PGMEA (1500) CyH (500) | 4.0 | 4.0 |
| Example 5 | Polymer 5 (100) | PAG 1 (14.0) | Quencher 1 (1.60) | PGMEA (1500) CyH (500) | 5.0 | 4.8 |
| Example 6 | Polymer 6 (100) | PAG 1 (14.0) | Quencher 1 (1.60) | PGMEA (1500) CyH (500) | 5.1 | 4.7 |
| Example 7 | Polymer 7 (100) | PAG 2 (14.0) | Quencher 1 (1.60) | PGMEA (1500) CyH (500) | 4.9 | 4.6 |
| Example 8 | Polymer 8 (100) | PAG 2 (14.0) | Quencher 1 (1.60) | PGMEA (1500) CyH (500) | 5.0 | 4.8 |
| Example 9 | Polymer 1 (100) | PAG 1 (14.0) | Quencher 1 (1.60) | PGMEA (1500) CyH (500) | 3.1 | 2.4 |
| Example 10 | Polymer 1 (100) | PAG 1 (14.0) | Quencher 1 (1.60) | PGMEA (1500) CyH (500) | 3.2 | 2.7 |
| Example 11 | Polymer 1 (100) | PAG 1 (14.0) TAG(1.0) | Quencher 1 (1.60) | PGMEA (1500) CyH (500) | 3.2 | 2.7 |
| Example 12 | Polymer 9 (100) | PAG 2 (14.0) | Quencher 1 (1.60) | PGMEA (1500) CyH (500) | 5.1 | 5.1 |
| Example 13 | Polymer 9 (100) | PAG 2 (14.0) | Quencher 1 (1.60) | PGMEA (1500) CyH (500) | 5.1 | 4.2 |
| Example 14 | Polymer 9 (100) | PAG 2 (14.0) | Quencher 1 (1.60) | PGMEA (1500) CyH (500) | 5.1 | 4.1 |
| Example 15 | Polymer 9 (100) | PAG 2 (14.0) | Quencher 1 (1.60) | PGMEA (1500) CyH (500) | 5.1 | 4.3 |
| Comparative Example 1 | Comparative polymer 1 (100) | PAG 1 (14.0) | Quencher 1 (1.60) | PGMEA (1500) CyH (500) | 4.2 | 5.6 |
| Comparative Example 2 | Comparative polymer 2 (100) | PAG 1 (14.0) | Quencher 1 (1.60) | PGMEA (1500) CyH (500) | 5.5 | 6.2 |

It must be stressed here that the present invention is not limited to the embodiments as disclosed above. The embodiments as disclosed above are mere examples, and therefore any embodiment having substantially the same composition as the technical concept disclosed in claims of the present invention and a similar effect thereof shall be included inside a technical range of the present invention.

What is claimed is:

1. A patterning process, in a patterning process comprising steps of at least: forming a single photoresist film on a substrate; exposing the photoresist film to a high energy beam; developing a photoresist by using a developer so as to form a photoresist pattern; and then forming a spacer only on the photoresist pattern sidewall, thereby forming a pattern on the substrate,
wherein a photoresist film composition to form the photoresist film is a chemically amplified positive resist composition, and a base polymer contained in the photoresist film composition contains repeating unit "a" having one or more adhesion groups selected from a hydroxyl group, a hydroxynaphthyl group, a hydroxyacenaphthyl group, a carboxy group, and a 2,2,2-trifluoro-1-hydroxyethyl group and repeating unit "c" having an acid labile group represented by the following general formula (c1),

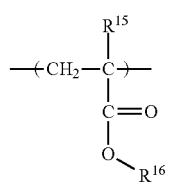

(c1)

wherein, $R^{15}$ represents a hydrogen atom or a methyl group, and $R^{16}$ represents an acid labile group, and
wherein at least the photoresist pattern having the hardness of 0.4 GPa or more or the Young's modulus of 9.2 GPa or more as a film strength is formed and a pattern is formed on the substrate by forming a silicon oxide film as the spacer on the photoresist pattern sidewall.

2. The patterning process according to claim 1, wherein the silicon oxide film is formed by a CVD method or an ALD method.

3. The patterning process according to claim 2, wherein the hardness is measured by a nanoindenter method.

4. The patterning process according to claim 3, wherein a photoresist film composition to form the photoresist film is a chemically amplified positive resist composition.

5. The patterning process according to claim 2, wherein a photoresist film composition to form the photoresist film is a chemically amplified positive resist composition.

6. The patterning process according to claim 1, wherein the hardness is measured by a nanoindenter method.

7. The patterning process according to claim 6, wherein a photoresist film composition to form the photoresist film is a chemically amplified positive resist composition.

8. The patterning process according to claim 1, wherein a photoresist film composition to form the photoresist film is a chemically amplified positive resist composition.

9. The patterning process according to claim 1, wherein the photoresist pattern is cured by a light irradiation or a heat treatment after development and after the spacer is formed on the photoresist pattern sidewall.

10. The patterning process according to claim 1, wherein the spacer formed on the photoresist pattern sidewall is formed by removing the silicon oxide film in a space part of the photoresist pattern and the silicon oxide film on an upper part of the photoresist pattern in the silicon oxide film formed on the photoresist pattern, and a processing substrate in the underlayer is processed by using the spacer on the photoresist pattern sidewall as a mask.

11. The patterning process according to claim 10, wherein, before forming the photoresist film on the processing substrate, a carbon film with a carbon content of 75% or more by weight is formed by a CVD method or a spin coat method, the carbon film is processed by dry etching by using the spacer on the photoresist pattern sidewall as a mask, and the processing substrate is processed by using the carbon film thus processed as a mask.

12. The patterning process according to claim 11, wherein an anti-reflection film formed of a hydrocarbon material is formed between the carbon film and the photoresist film.

\* \* \* \* \*